(12) United States Patent
Higo et al.

(10) Patent No.: US 11,107,937 B2
(45) Date of Patent: Aug. 31, 2021

(54) PHOTOVOLTAIC DEVICE

(71) Applicant: SHARP KABUSHIKI KAISHA, Sakai (JP)

(72) Inventors: Teruaki Higo, Sakai (JP); Takeshi Mori, Sakai (JP); Makoto Higashikawa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/365,144

(22) Filed: Mar. 26, 2019

(65) Prior Publication Data

US 2019/0296164 A1  Sep. 26, 2019

(30) Foreign Application Priority Data

Mar. 26, 2018 (JP) .............................. JP2018-058360

(51) Int. Cl.
*H01L 31/0224* (2006.01)
*H01L 31/02* (2006.01)
*H01L 31/0216* (2014.01)
*H01L 31/0236* (2006.01)
*H01L 31/0747* (2012.01)
*H01L 31/20* (2006.01)

(52) U.S. Cl.
CPC ............ *H01L 31/022441* (2013.01); *H01L 31/02013* (2013.01); *H01L 31/02168* (2013.01); *H01L 31/02363* (2013.01); *H01L 31/0747* (2013.01); *H01L 31/202* (2013.01)

(58) Field of Classification Search
CPC ......... H01L 31/022441; H01L 31/0747; H01L 31/202; H01L 31/02363; H01L 31/02168; H01L 31/02013; H01L 31/075; H01L 31/0465; H01L 31/0516
See application file for complete search history.

(56) References Cited

U.S. PATENT DOCUMENTS

| 2010/0032014 A1 | 2/2010 | Bettinelli et al. | |
| 2011/0000532 A1* | 1/2011 | Niira ............... | H01L 31/0747 136/255 |
| 2016/0163898 A1* | 6/2016 | Harada ............. | H01L 31/022433 136/255 |

FOREIGN PATENT DOCUMENTS

JP  2010-522976 A  7/2010

* cited by examiner

*Primary Examiner* — Eli S Mekhlin
*Assistant Examiner* — Dujuan A Horton
(74) *Attorney, Agent, or Firm* — ScienBiziP, P.C.

(57) ABSTRACT

The n-type amorphous semiconductor layers 4 are on parts of that one of the faces of the semiconductor substrate 1, there being provided no p-type amorphous semiconductor layers 5 in the parts. The electrodes 6 are disposed on the n-type amorphous semiconductor layers 4. The electrodes 7 are disposed on the p-type amorphous semiconductor layers 5. The p-type amorphous semiconductor layers 5 between those n-type amorphous semiconductor layers 4 which are adjacent along an in-plane direction of the semiconductor substrate 1 include, arranged along a first direction that points from the n-type amorphous semiconductor layers 4 toward the adjacent n-type amorphous semiconductor layers 4: first and second electrode-provided regions where the electrodes 7 are disposed; and a no-electrode-provided region, between the first and second electrode-provided regions, where there are provided no electrodes 7.

6 Claims, 15 Drawing Sheets

(a)

(b)

(c)

(d)

(e)

(j)

(k)

(a)

(b)

(c)

(d)

(e)

(f)

(a)

(b)

(a)

(b)

(c)

(d)

(e)

(f-1)

(g-1)

(h-1)

(i-1)

(j-1)

(k-1)

PHOTOVOLTAIC DEVICE

BACKGROUND OF THE INVENTION

Field of the Invention

This present invention relates to photovoltaic devices.

Background of the Invention

Back-contact photovoltaic devices are conventionally known (Published Japanese Translation of PCT Application, Tokuhyo, No. 2010-522976). Published Japanese Translation of PCT Application, Tokuhyo, No. 2010-522976 describes a photovoltaic device with a heterojunction structure. This photovoltaic device includes: a substrate; an amorphous silicon layer on one of the faces of the substrate; a n-type amorphous silicon layer on parts of the amorphous silicon layer; a p-type amorphous silicon layer on other parts of the amorphous silicon layer; electrodes on the n-type amorphous silicon layer; and electrodes on the p-type amorphous silicon layer.

SUMMARY OF THE INVENTION

Heterojunction back-contact photovoltaic devices have a problem that the light entering the photovoltaic device through its front face, which is a light-incident surface, is not reflected off the regions of its back face where there are provided electrodes so well as off the regions where there are provided no electrodes, because the electrodes are in contact with a non-monocrystalline semiconductor layer. The reflectance on the back face is evidently poor especially where the amorphous silicon layer is in direct contact with metal electrodes. Meanwhile, the width of electrodes that collect minority carriers affect E-shade (in-plane distance in the photovoltaic device from the center of a BSF (back surface field) to an end of an electrode where minority carriers are collected). Minimizing E-shade reduces the distance that minority carriers need to travel and thereby increases photocurrent collection.

In view of these problems and conditions, the present invention, in an embodiment thereof, provides a photovoltaic device capable of increased photocurrent generation.

Structure 1

The present invention, in an embodiment thereof, is directed to a photovoltaic device including: a crystalline semiconductor substrate; first non-monocrystalline semiconductor layers; second non-monocrystalline semiconductor layers; first electrodes; and second electrodes. The crystalline semiconductor substrate is of a first conductivity type. The first non-monocrystalline semiconductor layers are of the first conductivity type and disposed on one of faces of the crystalline semiconductor substrate. The second non-monocrystalline semiconductor layers are of a second conductivity type that is opposite the first conductivity type and disposed at least on parts of that one of the faces of the crystalline semiconductor substrate, there being provided no first non-monocrystalline semiconductor layers in the parts. The first electrodes are disposed on the first non-monocrystalline semiconductor layers. The second electrodes are disposed on the second non-monocrystalline semiconductor layers. The photovoltaic device has regions where the first non-monocrystalline semiconductor layers and the second non-monocrystalline semiconductor layers are arranged alternately along an in-plane direction of the crystalline semiconductor substrate. The second non-monocrystalline semiconductor layers between those first non-monocrystalline semiconductor layers which are adjacent along an in-plane direction of the crystalline semiconductor substrate include, arranged along a first direction which is an in-plane direction of the crystalline semiconductor substrate pointing from the first non-monocrystalline semiconductor layers toward the adjacent first non-monocrystalline semiconductor layers: a first electrode-provided region where the second electrodes are disposed; a second electrode-provided region where the second electrodes are disposed; and a no-electrode-provided region, between the first electrode-provided region and the second electrode-provided region, where there are provided no second electrodes.

Structure 2

In structure 1, the first non-monocrystalline semiconductor layers between those second non-monocrystalline semiconductor layers which are adjacent in the alternately arranged regions may include, arranged along the first direction: a third electrode-provided region where the first electrodes are disposed; a fourth electrode-provided region where the first electrodes are disposed; and a no-electrode-provided region, between the third electrode-provided region and the fourth electrode-provided region, where there are provided no first electrodes.

Structure 3

In structure 1 or 2, the second non-monocrystalline semiconductor layers may include: the first electrode-provided region located closer to a first first-direction end of the second non-monocrystalline semiconductor layers; and the second electrode-provided region located closer to a second first-direction end of the second non-monocrystalline semiconductor layers and at a distance from the first electrode-provided region, the second first-direction end being opposite the first first-direction end of the second non-monocrystalline semiconductor layers.

Structure 4

In structure 3, the second non-monocrystalline semiconductor layers may further include a fifth electrode-provided region where the second electrodes are disposed connecting the first electrode-provided region and the second electrode-provided region.

Structure 5

In any of structures 1 to 4, the photovoltaic device may further include: first wires connected to the first electrodes via a conductive adhesive; and second wires connected to the second electrodes via a conductive adhesive.

Structure 6

In structure 4, the photovoltaic device may further include: first wires connected to the first electrodes via a conductive adhesive; and second wires connected to the second electrodes via a conductive adhesive. The second wires may be connected to the second electrodes via a conductive adhesive at least in the fifth electrode-provided region.

The present invention, in an embodiment thereof, provides a photovoltaic device capable of increased photocurrent generation.

DESCRIPTION OF EMBODIMENTS

Figure 1:
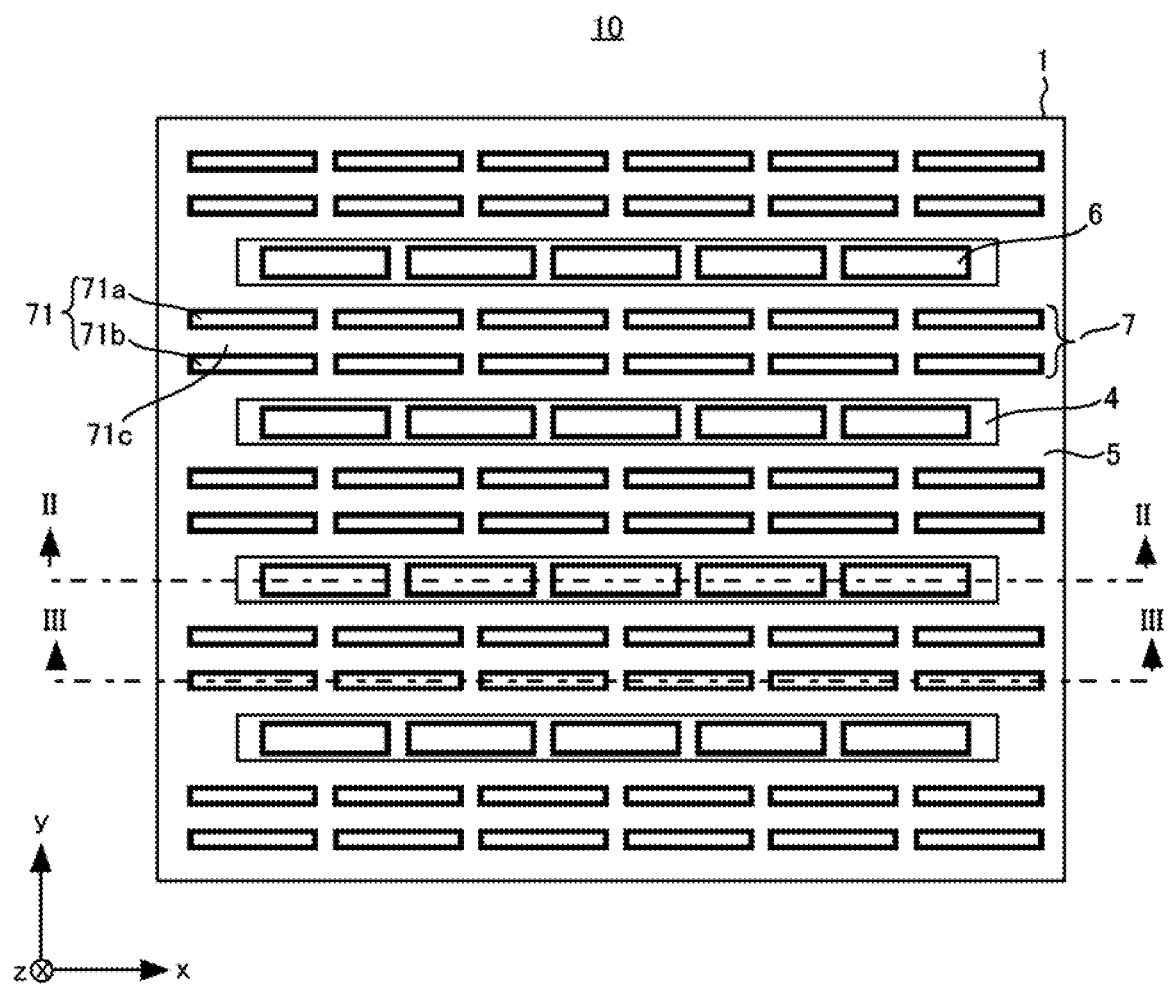
FIG. 1 is a plan view of a photovoltaic device in accordance with Embodiment 1.

The following will describe in detail embodiments of the present invention in reference to drawings. Identical or equivalent members in the drawings will be denoted by the same reference signs, and description thereof is not repeated.

Embodiment 1

Figure 2:
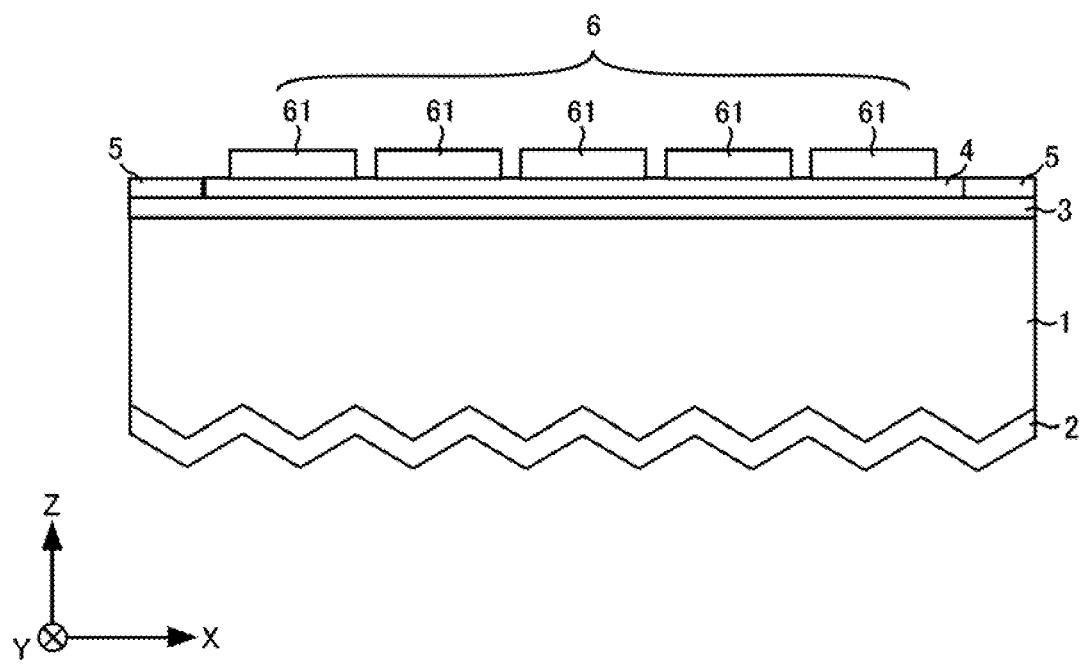
FIG. 2 is a cross-sectional view of the photovoltaic device shown in FIG. 1, taken along line II-II.
Figure 3:
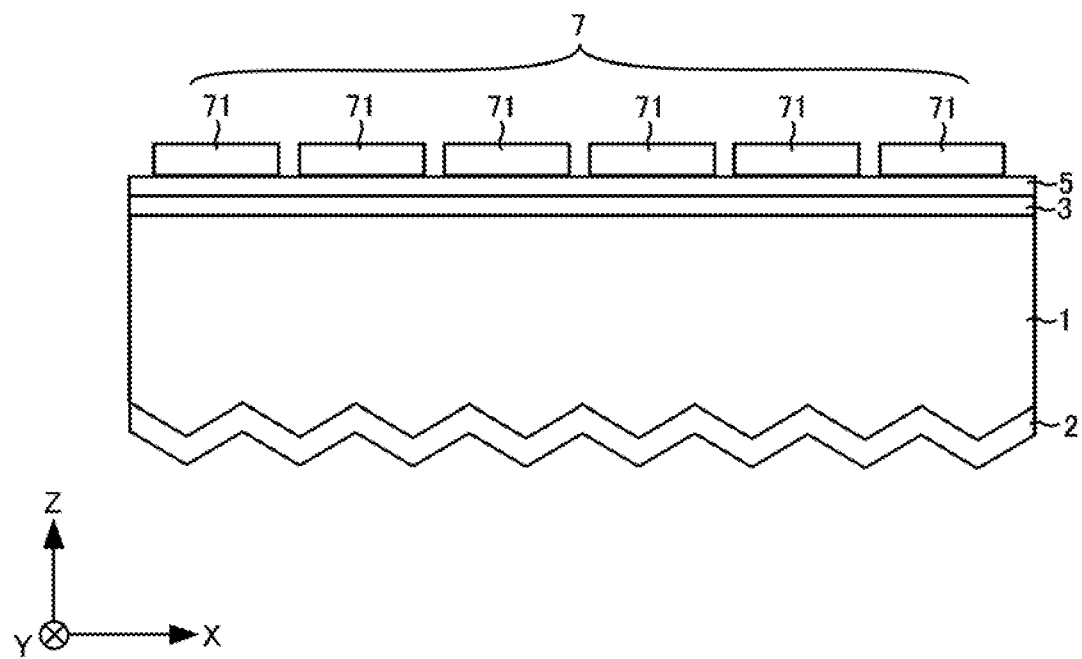
FIG. 3 is a cross-sectional view of the photovoltaic device shown in FIG. 1, taken along line III-III.

FIG. 1 is a plan view of a photovoltaic device in accordance with Embodiment 1. FIG. 2 is a cross-sectional view of the photovoltaic device shown in FIG. 1, taken along line II-II FIG. 3 is a cross-sectional view of the photovoltaic device shown in FIG. 1, taken along line III-III. Note that FIG. 1 is a plan view of the photovoltaic device as viewed from a side opposite its light-incident side. An x-, a y-, and a z-axis are specified as shown in FIGS. 1 to 3.

Referring to FIGS. 1 to 3, a photovoltaic device 10 in accordance with Embodiment 1 includes a semiconductor substrate 1, an antireflective film 2, an i-type amorphous semiconductor layer 3, a n-type amorphous semiconductor layer 4, a p-type amorphous semiconductor layer 5, and electrodes 6 and 7.

The semiconductor substrate 1, as an example, is composed of a n-type monocrystalline silicon substrate and has a thickness of 100 to 200 μm. The semiconductor substrate 1 has, for example, a crystal orientation of (100) and a specific resistance of 1 to 10 Ωcm. The semiconductor substrate 1 has texture on its front face, which is a light-incident surface.

The antireflective film 2 is disposed on the light-incident, front face of the semiconductor substrate 1. The antireflective film 2 includes, as an example, a stack of silicon oxide and silicon nitride. In this example, the silicon oxide is in contact with the semiconductor substrate 1, and the silicon nitride is in contact with the silicon oxide. The antireflective film 2 has a thickness of, for example, 100 to 1,000 nm.

The i-type amorphous semiconductor layer 3 is disposed across one of the faces of the semiconductor substrate 1.

The n-type amorphous semiconductor layer 4 is disposed at least on those parts of the i-type amorphous semiconductor layer 3 where there is provided no p-type amorphous semiconductor layer 5. The n-type amorphous semiconductor layer 4, as an example, is composed of n-type amorphous silicon and extended in the x-axis direction so as to be rectangular in a plan view.

The p-type amorphous semiconductor layer 5 is disposed on the i-type amorphous semiconductor layer 3 in contact with the i-type amorphous semiconductor layer 3. The p-type amorphous semiconductor layer 5, as an example, is composed of p-type amorphous silicon.

Since the n-type amorphous semiconductor layer 4 is disposed at least where there is provided no p-type amorphous semiconductor layer 5 and has a shape elongated in the x-axis direction in a plan view, the n-type amorphous semiconductor layer 4 and the p-type amorphous semiconductor layer 5 are arranged alternately along the y-axis direction.

The electrodes 6 are disposed on the n-type amorphous semiconductor layer 4. The electrodes 6 are disposed in a plurality of electrode-provided regions 61 arranged at desired intervals along the x-axis direction.

The electrodes 7 are disposed on the p-type amorphous semiconductor layer 5. The electrodes 7 are disposed in a plurality of electrode-provided regions 71 arranged at desired intervals along the x-axis direction. The electrode-provided regions 71 include first electrode-provided regions 71a and second electrode-provided regions 71b. The electrode-provided regions 71a are disposed closer to a y-axis end of the p-type amorphous semiconductor layer 5. The electrode-provided regions 71b are spaced apart from the electrode-provided regions 71a by a distance in the y-axis direction and disposed closer to the other y-axis end of the p-type amorphous semiconductor layer 5.

In a row of electrodes 6 and an adjacent row of electrodes 7, the regions where there are provided no electrodes 6 are located at different x-axis positions from the regions where there are provided no electrodes 7. The electrodes 7 have a larger width (length in the y-axis direction) than the electrodes 6.

Since the electrodes 7 are disposed in a plurality of electrode-provided regions 71, the p-type amorphous semiconductor layer 5 includes, arranged along the y-axis direction: the electrode-provided regions 71a where the electrodes 7 are disposed; the electrode-provided regions 71b where the electrodes 7 are disposed; and no-electrode-provided regions 71c between the electrode-provided regions 71a and 71b where there are provided no electrodes 7.

The i-type amorphous semiconductor layer 3 is composed of, for example, i-type amorphous silicon, i-type amorphous silicon carbide, i-type amorphous silicon nitride, i-type amorphous silicon oxide, or i-type amorphous silicon nitride oxide. The i-type amorphous semiconductor layer 3 has a thickness of, for example, 5 to 30 nm.

The "i-type" semiconductor does not only refer to a completely intrinsic semiconductor, but also encompasses semiconductors contaminated with a n- or p-type impurity of sufficiently low concentration (both the n-type impurity concentration and the p-type impurity concentration are lower than $1 \times 10^{15}$ atoms/cm$^3$).

The "amorphous silicon," throughout the embodiments of the present invention, does not only refer to amorphous silicon containing silicon atoms with a dangling bond (i.e., an unhydrogenated end), but also encompasses hydrogenated amorphous silicon and other like silicon containing no atoms with a dangling bond.

The p-type amorphous semiconductor layer 5 is composed of, for example, p-type amorphous silicon, p-type amorphous silicon carbide, p-type amorphous silicon nitride, p-type amorphous silicon oxide, or p-type amorphous silicon nitride oxide. The p-type amorphous semiconductor layer 5 has a thickness of, for example, 5 to 30 nm.

The p-type amorphous semiconductor layer 5 may contain, for example, boron (B) as a p-type impurity. The "p-type" semiconductor, throughout the embodiments of the present invention, has a p-type impurity concentration of at least $1 \times 10^{15}$ atoms/cm$^3$.

The n-type amorphous semiconductor layer 4 is composed of, for example, n-type amorphous silicon, n-type amorphous silicon carbide, n-type amorphous silicon nitride, n-type amorphous silicon oxide, or n-type amorphous silicon nitride oxide. The n-type amorphous semiconductor layer 4 has a thickness of, for example, 5 to 30 nm.

The n-type amorphous semiconductor layer 4 may contain, for example, phosphorus (P) as a n-type impurity. The "n-type" semiconductor, throughout the embodiments of the present invention, has a n-type impurity concentration of at least $1 \times 10^{15}$ atoms/cm$^3$.

The electrodes 6 and 7 are composed of, for example, silver and have thicknesses ranging from 100 to 800 nm.

Figure 4:
FIG. 4 is a first manufacturing step diagram representing steps of manufacturing the photovoltaic device shown in FIGS. 1 to 3.
Figure 4:
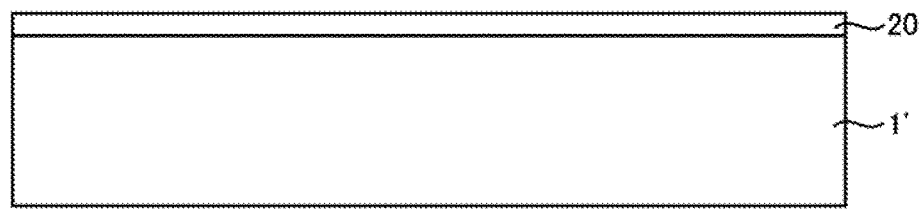
Figure 4:
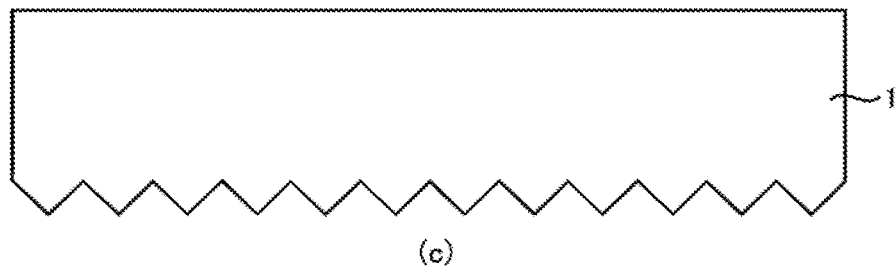
Figure 4:
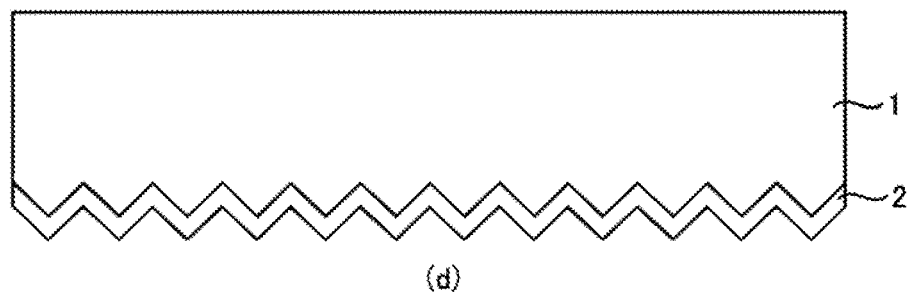
Figure 4:
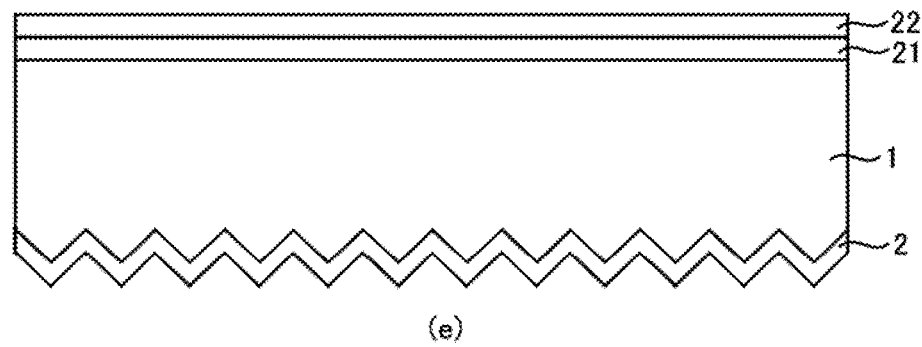
Figure 5:
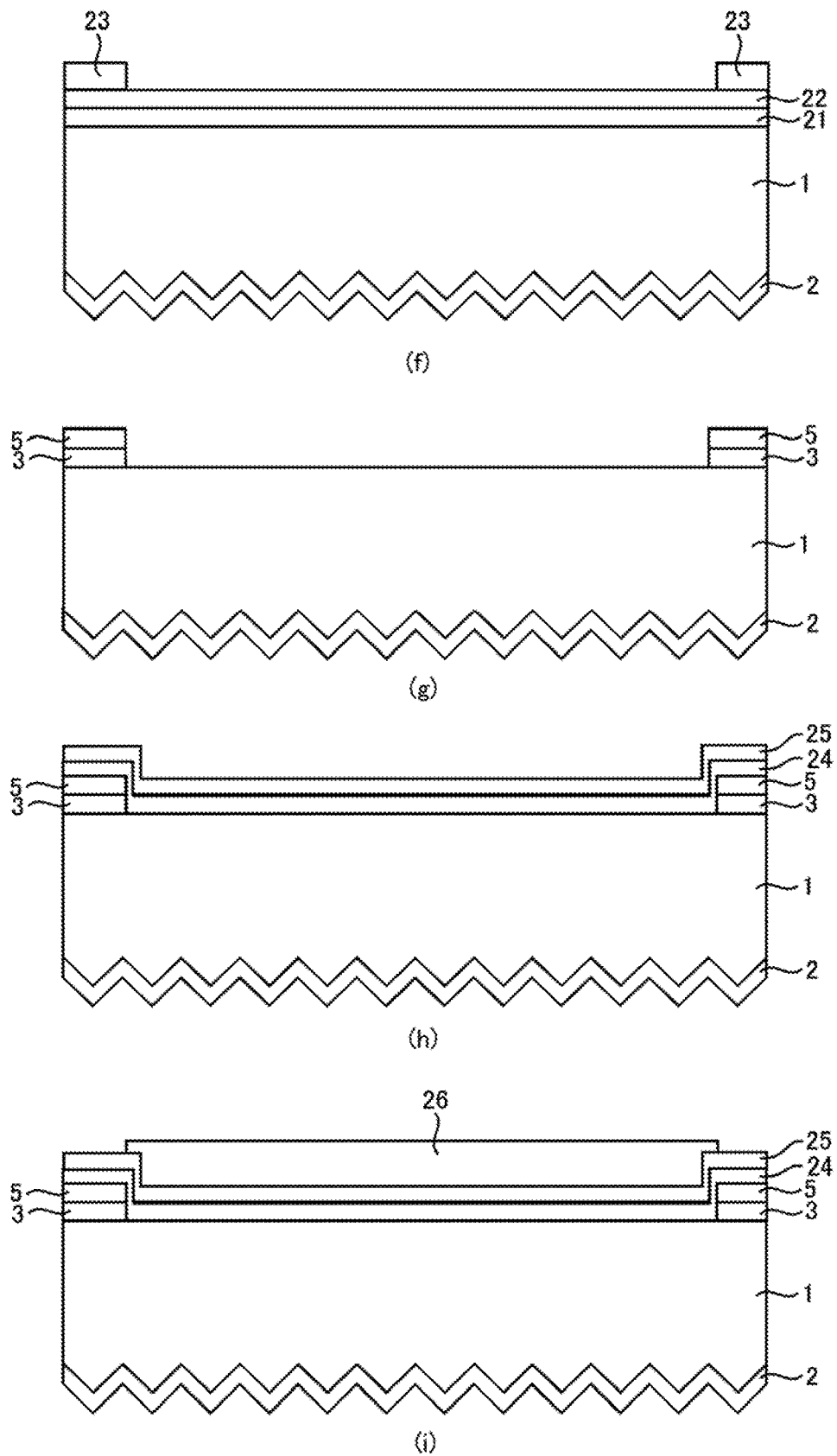
FIG. 5 is a second manufacturing step diagram representing steps of manufacturing the photovoltaic device shown in FIGS. 1 to 3.
Figure 6:
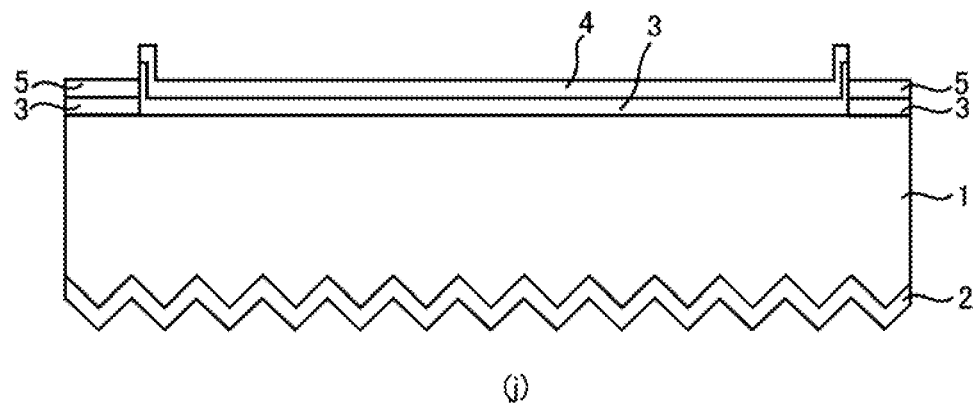
FIG. 6 is a third manufacturing step diagram representing steps of manufacturing the photovoltaic device shown in FIGS. 1 to 3.
Figure 6:
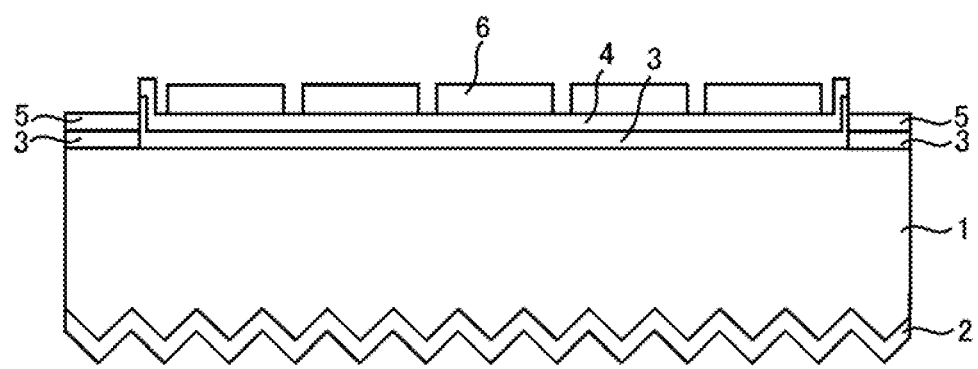

FIGS. 4 to 6 are first to third manufacturing step diagrams respectively, representing steps of manufacturing the photovoltaic device 10 shown in FIGS. 1 to 3. The manufacturing step diagrams shown in FIGS. 4 to 6 are drawn based on cross-sectional views taken along line II-II in FIG. 1.

Now referring to FIG. 4, a semiconductor substrate 1' is prepared at the start of the manufacture of the photovoltaic device 10 (step (a) in FIG. 4). The semiconductor substrate 1' has the same crystal orientation, specific resistance, conductivity type, and thickness as the semiconductor substrate 1.

A protective film 20 is then formed on one of the faces of the semiconductor substrate 1' (step (b) in FIG. 4). The protective film 20 is composed of, for example, silicon oxide and silicon nitride and formed by, for example, sputtering.

Thereafter, the semiconductor substrate 1' on which the protective film 20 has been formed is etched in an alkaline solution of, for example, NaOH or KOH (e.g., an aqueous solution of KOH (1 to 5 wt %) and isopropyl alcohol (1 to 10 wt %)). This technique anisotropically etches a surface of the semiconductor substrate 1' that is opposite the face thereof carrying the protective film 20 thereon, thereby forming a pyramidal texture on that surface. The protective film 20 is then removed to obtain the semiconductor substrate 1 (see step (c) in FIG. 4).

Subsequently, the antireflective film 2 is formed on the surface of the semiconductor substrate 1 on which the texture has been formed (step (d) in FIG. 4). More specifically, the antireflective film 2 is formed, for example, by sequentially depositing silicon oxide and silicon nitride on the semiconductor substrate 1 by sputtering.

Following step (d), an i-type amorphous semiconductor layer 21 and a p-type amorphous semiconductor layer 22 are sequentially formed on a surface of the semiconductor substrate 1 that is opposite the face thereof carrying the texture thereon (step (e) in FIG. 4). The i-type amorphous semiconductor layer 21 and the p-type amorphous semiconductor layer 22 may be formed by plasma CVD (chemical vapor deposition) or any other method.

Conditions are publicly known for forming the i-type amorphous semiconductor layer 21 by plasma CVD from, for example, i-type amorphous silicon, i-type amorphous silicon carbide, i-type amorphous silicon nitride, i-type amorphous silicon oxide, or i-type amorphous silicon nitride oxide. These publicly known conditions may be used to form the i-type amorphous semiconductor layer 21.

Conditions are publicly known for forming the p-type amorphous semiconductor layer 22 by plasma CVD from, for example, p-type amorphous silicon, p-type amorphous silicon carbide, p-type amorphous silicon nitride, p-type amorphous silicon oxide, or p-type amorphous silicon nitride oxide. These publicly known conditions may be used to form the p-type amorphous semiconductor layer 22.

Next, referring to FIG. 5, following step (e), a photoresist is applied onto the p-type amorphous semiconductor layer 22 and patterned by photolithography to form a resist pattern 23 (step (f) in FIG. 5).

Next, a stack of the i-type amorphous semiconductor layer 21 and the p-type amorphous semiconductor layer 22 is partly etched out in the thickness direction using the resist pattern 23 as a mask (step (g) in FIG. 5). This step exposes parts of the backside of the semiconductor substrate 1 (surface of the semiconductor substrate 1 that is opposite the face thereof carrying the texture thereon). The step also forms the i-type amorphous semiconductor layer 3 and the p-type amorphous semiconductor layer 5.

An i-type amorphous semiconductor layer 24 is then formed in contact with the exposed parts of the backside of the semiconductor substrate 1 and also in contact with the p-type amorphous semiconductor layer 5. Thereafter, a n-type amorphous semiconductor layer 25 is formed in contact with the entire surface of the i-type amorphous semiconductor layer 24 (step (h) in FIG. 5). The i-type amorphous semiconductor layer 24 and the n-type amorphous semiconductor layer 25 may be formed, for example, by plasma CVD or any other method.

Conditions are publicly known for forming the i-type amorphous semiconductor layer 24 by plasma CVD from, for example, i-type amorphous silicon, i-type amorphous silicon carbide, i-type amorphous silicon nitride, i-type amorphous silicon oxide, or i-type amorphous silicon nitride oxide. These publicly known conditions may be used to form the i-type amorphous semiconductor layer 24.

Conditions are also publicly known for forming the n-type amorphous semiconductor layer 25 by plasma CVD from, for example, n-type amorphous silicon, n-type amorphous silicon carbide, n-type amorphous silicon nitride, n-type amorphous silicon oxide, or n-type amorphous silicon nitride oxide. These publicly known conditions may be used to form the n-type amorphous semiconductor layer 25.

Following step (h), a photoresist is applied onto the n-type amorphous semiconductor layer 25 and patterned by photolithography to form a resist pattern 26 (step (i) in FIG. 5).

Next, a stack of the i-type amorphous semiconductor layer 24 and the n-type amorphous semiconductor layer 25 is partly etched out in the thickness direction using the resist pattern 26 as a mask. The resist pattern 26 is then removed. This step exposes parts of the surface of the p-type amorphous semiconductor layer 5 (step (j) in FIG. 6). The step also forms the i-type amorphous semiconductor layer 3 and the n-type amorphous semiconductor layer 4.

Then, the electrodes 6 are formed on the n-type amorphous semiconductor layer 4 (step (k) in FIG. 6). The electrodes 7 are also formed on the p-type amorphous semiconductor layer 5 (not shown in step (k)). The electrodes 6 and 7 may be formed by sputtering or vapor deposition using a metal or other mask. This step completes the manufacture of the photovoltaic device 10.

Figure 7:
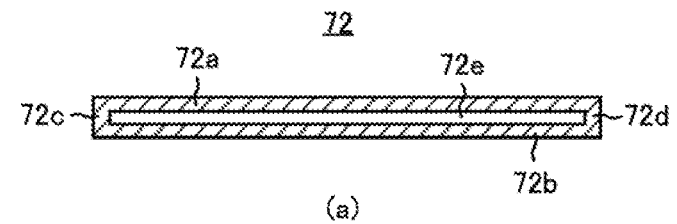
FIG. 7 is drawings showing example shapes of regions where electrodes are to be provided ("electrode-provided regions").
Figure 7:
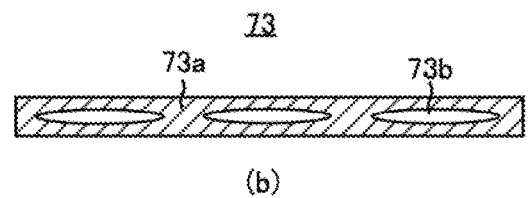
Figure 7:
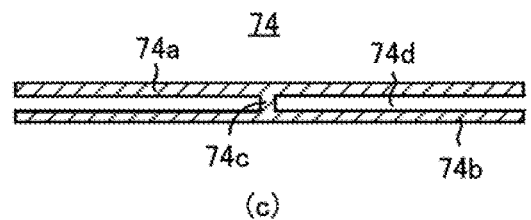
Figure 7:
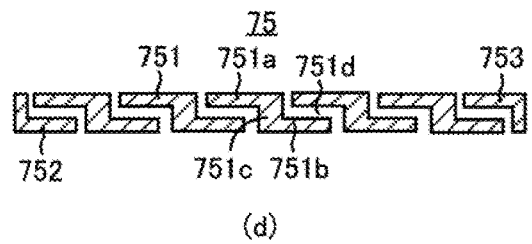
Figure 7:
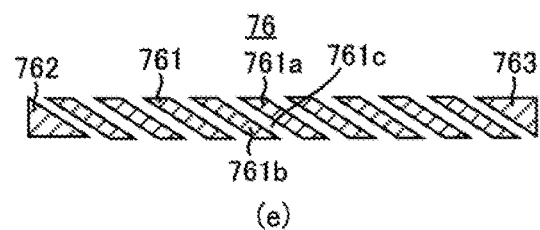
Figure 7:
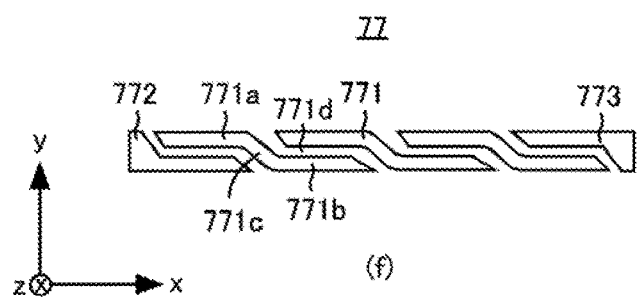

FIG. 7 is drawings showing example shapes of regions where electrodes are to be provided ("electrode-provided regions"). Referring to FIG. 7, an electrode-provided region 72 includes electrode-provided regions 72a to 72d (see FIG. 7(a)). The first electrode-provided region 72a is provided linearly in the x-axis direction, closer to a y-axis end of the p-type amorphous semiconductor layer 5. The second electrode-provided region 72b is provided linearly in the x-axis direction and at a distance from the electrode-provided region 72a, closer to the other y-axis end of the p-type amorphous semiconductor layer 5. The electrode-provided region 72c is provided linearly in the y-axis direction, connecting an x-axis end of the electrode-provided region 72a to an x-axis end of the electrode-provided region 72b. The electrode-provided region 72d is provided linearly in the y-axis direction, connecting the other x-axis end of the electrode-provided region 72a to the other x-axis end of the electrode-provided region 72b. The electrode-provided regions 72a to 72d have the same width as the electrode-provided regions 71a and 71b. A no-electrode-provided region 72e is provided surrounded by these electrode-provided regions.

An electrode-provided region 73 includes an electrode-provided region 73a and no-electrode-provided regions 73b (see FIG. 7(b)). The electrode-provided region 73a is rectangular in a plan view. The no-electrode-provided regions 73b are arranged inside the electrode-provided region 73a at desired intervals along the x-axis direction.

An electrode-provided region 74 includes electrode-provided regions 74a to 74c. No-electrode-provided regions 74d are provided between these electrode-provided regions (see FIG. 7(c)). The electrode-provided region 74a is provided linearly in the x-axis direction, closer to a y-axis end of the p-type amorphous semiconductor layer 5. The electrode-provided region 74b is provided linearly in the x-axis direction and at a distance from the electrode-provided region 74a, closer to the other y-axis end of the p-type amorphous semiconductor layer 5. The electrode-provided region 74c is provided linearly in the y-axis direction, connecting an x-axis midportion of the electrode-provided region 74a to an x-axis midportion of the electrode-provided region 74b. The electrode-provided regions 74a to 74c have the same width as the electrode-provided regions 71a and 71b. The electrode-provided region 74c may alternatively be provided linearly in the y-axis direction, connecting an x-axis non-midportion of the electrode-provided region 74a to an x-axis non-midportion of the electrode-provided region 74b.

An electrode-provided region 75 includes a plurality of electrode-provided regions 751 and a pair of electrode-provided regions 752 and 753 (see FIG. 7(d)). The electrode-provided regions 751 are disposed between the electrode-provided region 752 and the electrode-provided region 753 as viewed in the x-axis direction and arranged at desired intervals along the x-axis direction. The electrode-provided regions 752 and 753 are shaped like a hook in a plan view. The electrode-provided region 753 matches the electrode-provided region 752 when flipped in the x- and y-axis directions.

Each electrode-provided region 751 includes electrode-provided regions 751a to 751c. A no-electrode-provided region 751d is provided between these electrode-provided regions. The electrode-provided region 751a is provided linearly in the x-axis direction, closer to a y-axis end of the p-type amorphous semiconductor layer 5. The electrode-provided region 751b is provided linearly in the x-axis direction and at a distance from the electrode-provided region 751a, closer to the other y-axis end of the p-type amorphous semiconductor layer 5. The electrode-provided region 751c is provided linearly in the y-axis direction, connecting an x-axis end of the electrode-provided region 751a to an x-axis opposite end of the electrode-provided region 751b. As a result, each electrode-provided region 751 has a shape that appears like steps in terms of the y-axis direction in a plan view. The electrode-provided regions 751 are then arranged along the x-axis direction such that the electrode-provided region 751a of one of two electrode-provided regions 751 that are adjacent along the x-axis direction is located facing the electrode-provided region 751b of the other electrode-provided region 751.

In the electrode-provided region 75, the electrode-provided region 751c is not necessarily provided along the y-axis direction and may be disposed at any desired angle to the x-axis direction.

Further alternatively, the electrode-provided region 751c may be provided so as to connect any part of the electrode-provided region 751a to any part of the electrode-provided region 751b in terms of the x-axis direction.

An electrode-provided region 76 includes a plurality of electrode-provided regions 761 and a pair of electrode-provided regions 762 and 763 (see FIG. 7(e)). The electrode-provided regions 761 are disposed between the electrode-provided region 762 and the electrode-provided region 763 as viewed in the x-axis direction and arranged at desired intervals along the x-axis direction. The electrode-provided regions 762 and 763 are triangular in a plan view. The electrode-provided region 763 matches the electrode-provided region 762 when flipped in the x- and y-axis directions. Each electrode-provided region 761 includes electrode-provided regions 761a and 761b. A no-electrode-provided regions 761c is provided between these electrode-provided regions.

The electrode-provided regions 761 are provided linearly at a desired angle (e.g., 45°) to the x-axis in a plan view.

An electrode-provided region 77 includes a plurality of electrode-provided regions 771 and a pair of electrode-provided regions 772 and 773 (see FIG. 7(f)). The electrode-provided regions 771 are disposed between the electrode-provided region 772 and the electrode-provided region 773 as viewed in the x-axis direction and arranged at desired intervals along the x-axis direction. The electrode-provided regions 772 and 773 are shaped generally like a hook in a plan view. The electrode-provided region 773 matches the electrode-provided region 772 when flipped in the x- and y-axis directions.

Each electrode-provided region 771 includes electrode-provided regions 771a to 771c. A no-electrode-provided region 771d is provided between these electrode-provided regions. The electrode-provided region 771a is provided linearly in the x-axis direction, closer to a y-axis end of the p-type amorphous semiconductor layer 5. The electrode-provided region 771b is provided linearly in the x-axis direction and at a distance from the electrode-provided region 771a, closer to the other y-axis end of the p-type amorphous semiconductor layer 5. The electrode-provided region 771c is provided linearly at a desired angle (e.g., 45°) to the x-axis, connecting an x-axis end of the electrode-provided region 771a to an x-axis opposite end of the electrode-provided region 771b. As a result, each electrode-provided region 771 is wavy in a plan view.

The electrodes 7 of the photovoltaic device 10 are not necessarily disposed in the electrode-provided regions 71 and may instead be disposed in any of the electrode-provided regions 72 to 77, in Embodiment 1. In such a structure, the p-type amorphous semiconductor layer 5 includes, arranged along the y-axis direction: a first electrode-provided region where the electrodes 7 are disposed; a second electrode-provided region where the electrodes 7 are disposed; and a no-electrode-provided region between the first and second electrode-provided regions where there are provided no electrodes 7.

The electrode-provided regions where the electrodes 7 are disposed are not necessarily shaped like the electrode-provided regions 71 to 77. It is only required that the p-type amorphous semiconductor layer 5 be disposed alternately with the n-type amorphous semiconductor layer 4 and include, arranged along the y-axis direction: a first electrode-provided region where the electrodes 7 are disposed; a second electrode-provided region where the electrodes 7 are disposed; and a no-electrode-provided region between the first and second electrode-provided regions where there are provided no electrodes 7.

Table 1 shows specifications where the electrode-provided regions 71 and the electrode-provided region 75 are used as regions where electrodes are provided to collect minority carriers.

TABLE 1

| | Electrode Area Ratio | | Short-circuit |
| --- | --- | --- | --- |
| | All Electrodes/ Cell (%) | P-Electrodes, Relative Value | Photocurrent (Relative Value) |
| Example 1 | 50 | 0.65 | 1.0018 |
| Comparative Example 1 | 68 | 1.00 | 1.0000 |
| Example 2 | 58 | 0.75 | 1.0032 |
| Comparative Example 2 | 74 | 1.00 | 1.0000 |

Relating to Table 1, the electrode-provided regions 71 are used in Example 1, and the electrode-provided regions 75 are used in Example 2. Conventional electrode-provided regions that are generally rectangular in a plan view are used in Comparative Examples 1 and 2.

The electrode area ratio of all the electrodes to the cell is 50% in Example 1 and 68% in Comparative Example 1. The electrode area ratio of the electrodes 7 provided on the p-type amorphous semiconductor layer 5 (hereinafter, "P-electrodes") in Example 1 is 0.65 relative to that electrode area ratio in Comparative Example 1.

The electrode area ratio of all the electrodes to the cell is 58% in Example 2 and 74% in Comparative Example 2. The electrode area ratio of the P-electrodes in Example 2 is 0.75 relative to that electrode area ratio in Comparative Example 2.

Figure 8:
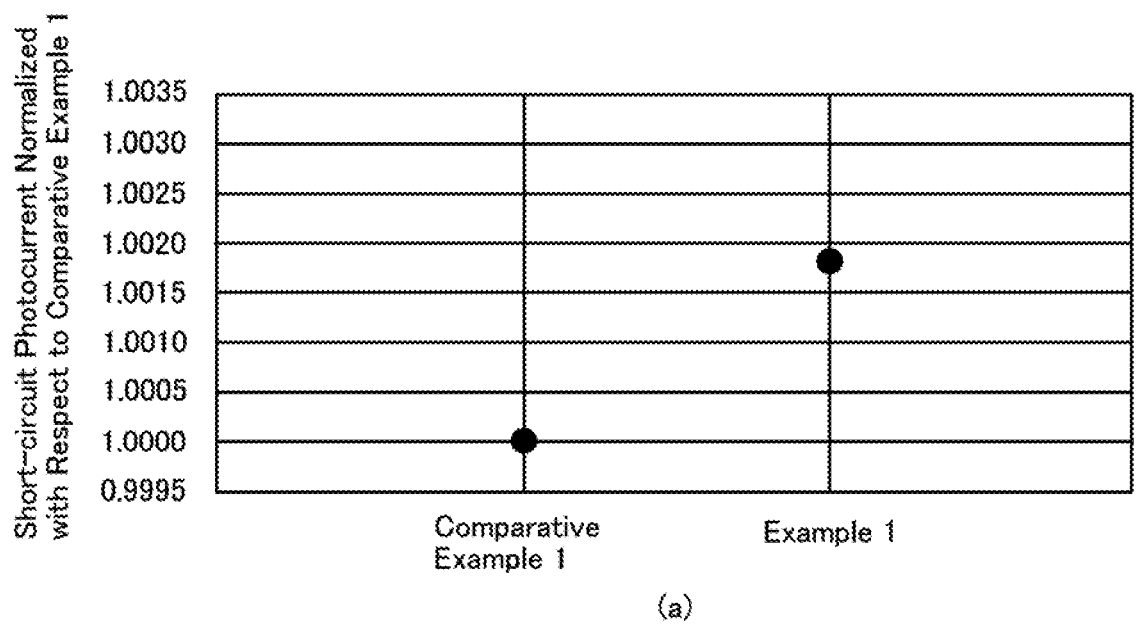
FIG. 8 is diagrams for comparison of short-circuit photocurrent in Example 1 and Example 2.
Figure 8:
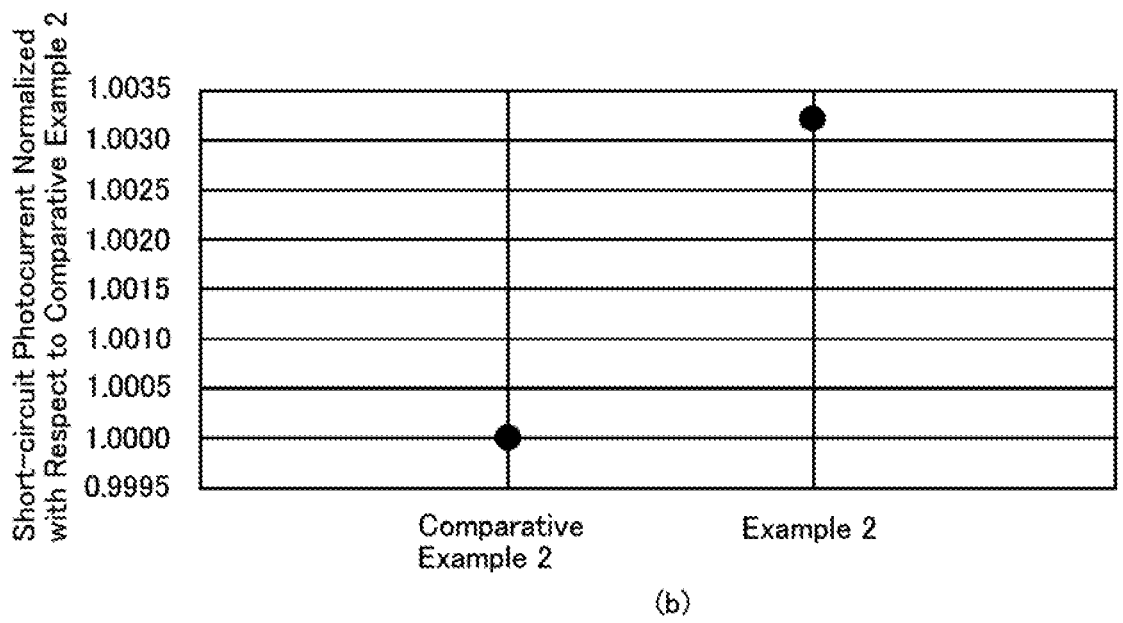

FIG. 8 is diagrams for comparison of short-circuit photocurrent for Example 1 and Example 2. Portion FIG. 8(a) shows a comparison of short-circuit photocurrent for Example 1 (electrode-provided regions 71) and Comparative Example 1. Portion FIG. 8(b) shows a comparison of short-circuit photocurrent for Example 2 (electrode-provided regions 75) and Comparative Example 2. The short-circuit photocurrent in Example 1 (electrode-provided regions 71) is normalized with respect to the short-circuit photocurrent in Comparative Example 1. The short-circuit photocurrent in Example 2 (electrode-provided regions 75) is normalized with respect to the short-circuit photocurrent in Comparative Example 2.

FIG. 8 shows that the short-circuit photocurrent in Example 1 (electrode-provided regions 71) is 1.0018 times the short-circuit photocurrent in Comparative Example 1 and that the short-circuit photocurrent in Example 2 (electrode-provided regions 75) is 1.0032 times the short-circuit photocurrent in Comparative Example 2.

As demonstrated here, the use of the electrode-provided regions 71 or the electrode-provided regions 75 increases short-circuit photocurrent over Comparative Examples 1 and 2. In addition, Example 2 (electrode-provided regions 75) increases short-circuit photocurrent by a larger proportion than Example 1 (electrode-provided regions 71).

Figure 9:
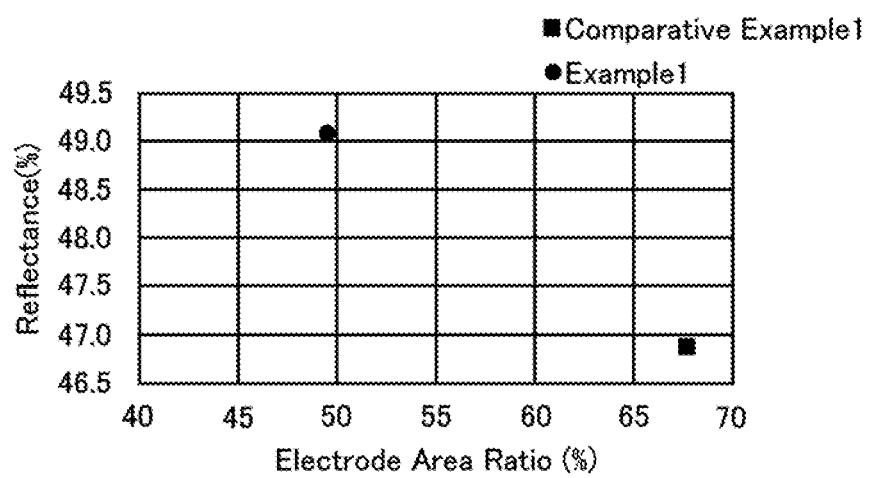
FIG. 9 is a diagram representing a relationship between a cell's reflectance and electrode area ratio.

FIG. 9 is a diagram representing a relationship between a cell's reflectance and electrode area ratio, where the vertical axis shows the reflectance of a cell, and the horizontal axis shows the electrode area ratio of all electrodes to a cell. A black circle denotes reflectance for Example 1 (electrode-provided regions 71), whereas a black square denotes reflectance for Comparative Example 1. The graph shows reflectance under light with a wavelength of 1,200 nm as an example.

FIG. 9 shows that Example 1 (electrode-provided regions 71) decreases electrode area ratio, but increases reflectance by 2% or more over Comparative Example 1. FIG. 9 also demonstrates that reflectance increases under long-wavelength light (1,000 to 1,200 nm).

It is understood from these data that reflectance increases under long-wavelength light (1,000 to 1,200 nm) if the p-type amorphous semiconductor layer 5 includes, arranged along the y-axis direction: a plurality of electrode-provided regions where there are provided electrodes; and a plurality of no-electrode-provided regions, between the electrode-provided regions, where there are provided no electrodes.

FIG. 8 shows that Example 1 (electrode-provided regions 71) and Example 2 (electrode-provided regions 75) increase short-circuit photocurrent over Comparative Examples 1 and 2 respectively. This is presumably because Examples 1 and 2, by decreasing electrode area ratio while maintaining low E-shade, increase reflectance under long-wavelength light, which increases absorption of long-wavelength light.

As mentioned earlier, the p-type amorphous semiconductor layer 5 in the photovoltaic device 10 includes, arranged along the y-axis direction: a plurality of electrode-provided regions where there are provided electrodes; and a plurality of no-electrode-provided regions, between the electrode-provided regions, where there are provided no electrodes. This structure increases electric current generation under light.

Figure 10:
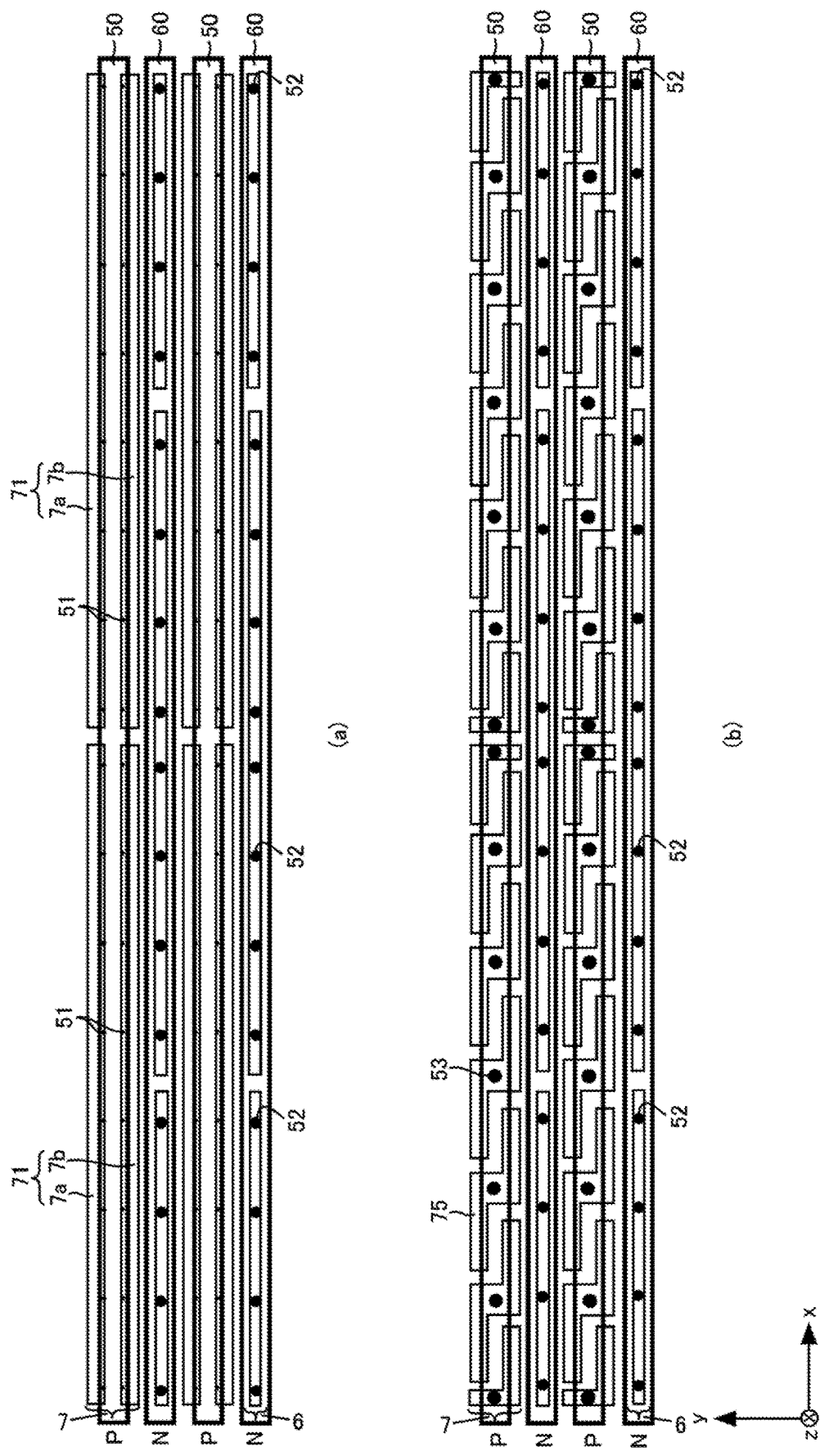
FIG. 10 is plan views showing connections between electrodes 6 and 7 and wires.

FIG. 10 is plan views showing connections between the electrodes 6 and 7 and wires. FIG. 10(a) shows connections between the electrodes 6 and 7 and wires where the electrodes 7 are arranged in the electrode-provided regions 71. FIG. 10(b) shows connections between the electrodes 6 and 7 and wires where the electrodes 7 are arranged in the electrode-provided regions 75.

Referring to FIG. 10, wires 50 are connected to the electrodes 7, and wires 60 are connected to the electrodes 6

(hereinafter, "N-electrodes") disposed on the n-type amorphous semiconductor layer 4.

Referring to FIG. 10(a), the wires 50 and 60 are arranged along the x-axis direction. The electrodes 7 disposed in the electrode-provided regions 71 are electrically connected to the wires 50 by a conductive adhesive 51. The electrodes 6 disposed in the electrode-provided regions 61 are electrically connected to the wires 60 by a conductive adhesive 52.

Referring to FIG. 10(b), the wires 50 and 60 are arranged along the x-axis direction. The electrodes 7 disposed in the electrode-provided regions 75 are electrically connected to the wires 50 by a conductive adhesive 53. The electrodes 6 disposed in the electrode-provided regions 61 are electrically connected to the wires 60 by the conductive adhesive 52.

When the electrodes 7 are disposed in the electrode-provided regions 75, the middle portion of each wire 50 ("middle" portion in terms of its width) overlaps the electrode 7. This structure gives a large margin in positioning the conductive adhesive 53 connecting the electrodes 7 to the wires 50, thereby improving stability in connecting the electrodes 7 to the wires 50.

If the P-electrodes (electrodes 7) are disposed in the electrode-provided regions 71 or in the electrode-provided regions 75 as described here, the wires 50 are arranged along the x-axis direction, and the electrodes 7 are electrically connected to the wires 50 by the conductive adhesive 51 (or the conductive adhesive 53).

The conductive adhesive simply needs to be capable of electrically connecting electrodes to wires. The conductive adhesive, for example, may be made of any substance and may have any shape. As an example, the conductive adhesive may be a solder.

Therefore, the electrodes 7 can be electrically connected to the wires 50 using the electrode-provided regions 71 or the electrode-provided regions 75.

The semiconductor substrate 1 has been described so far as being composed of n-type monocrystalline silicon. This is by no means intended to be limiting to the scope of the invention. The semiconductor substrate 1 in Embodiment 1 needs only to be composed of a n-type semiconductor or a p-type semiconductor. When the semiconductor substrate 1 is composed of a p-type monocrystalline semiconductor or a p-type polycrystalline semiconductor, the electrodes 6 include: electrode-provided regions 6a that have a larger width (length in the y-axis direction) than the electrodes 7 and the same shape in a plan view as electrode-provided regions 7a; and electrode-provided regions 6b that have the same shape in a plan view as electrode-provided regions 7b. The electrode-provided regions 6a are disposed closer to a y-axis end of the n-type amorphous semiconductor layer 4. The electrode-provided regions 6b are spaced apart from the electrode-provided regions 6a by a desired distance in the y-axis direction and disposed closer to the other y-axis end of the n-type amorphous semiconductor layer 4. The electrodes 6 are disposed in electrode-provided regions that have the same shape in a plan view as any of the electrode-provided regions 72 to 77.

Embodiment 2

Figure 11:
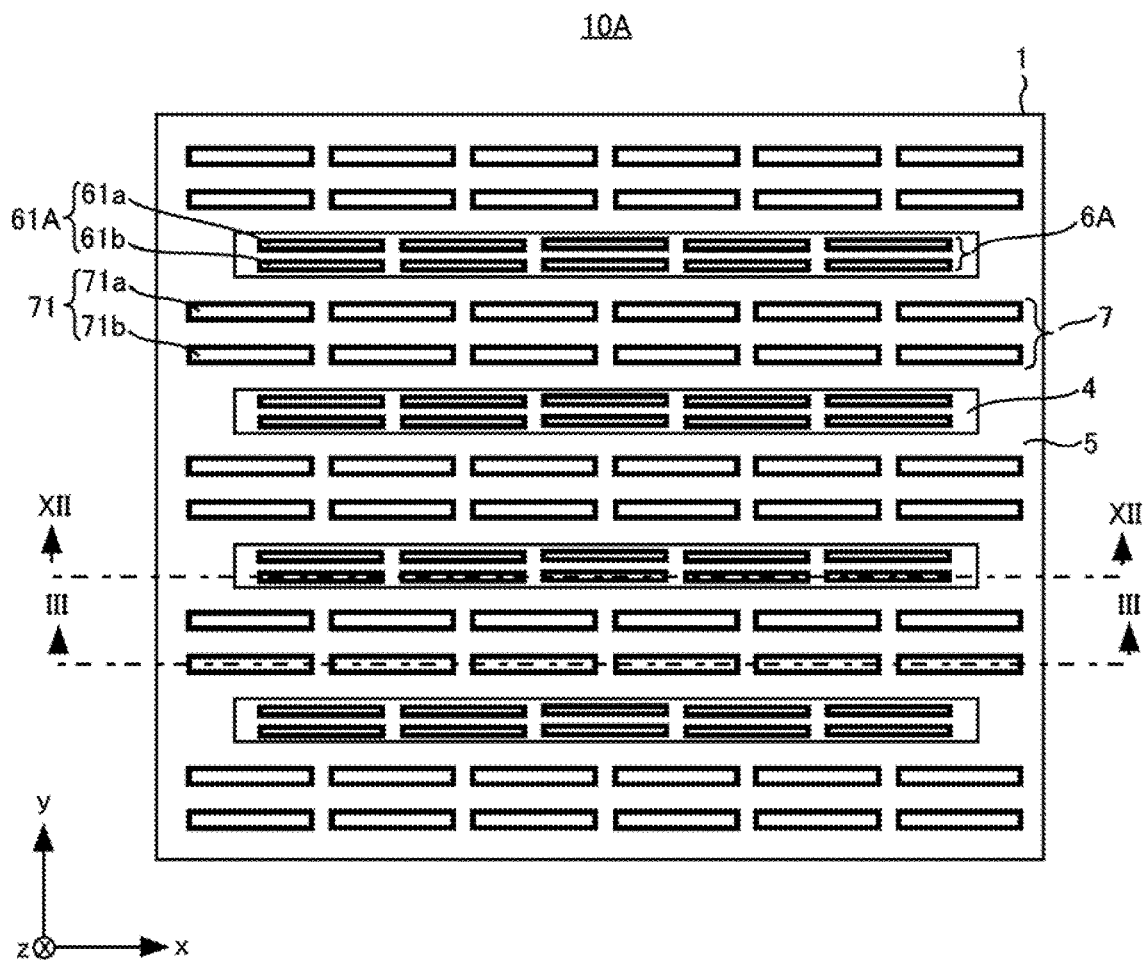
FIG. 11 is a plan view of a photovoltaic device in accordance with Embodiment 2.
Figure 12:
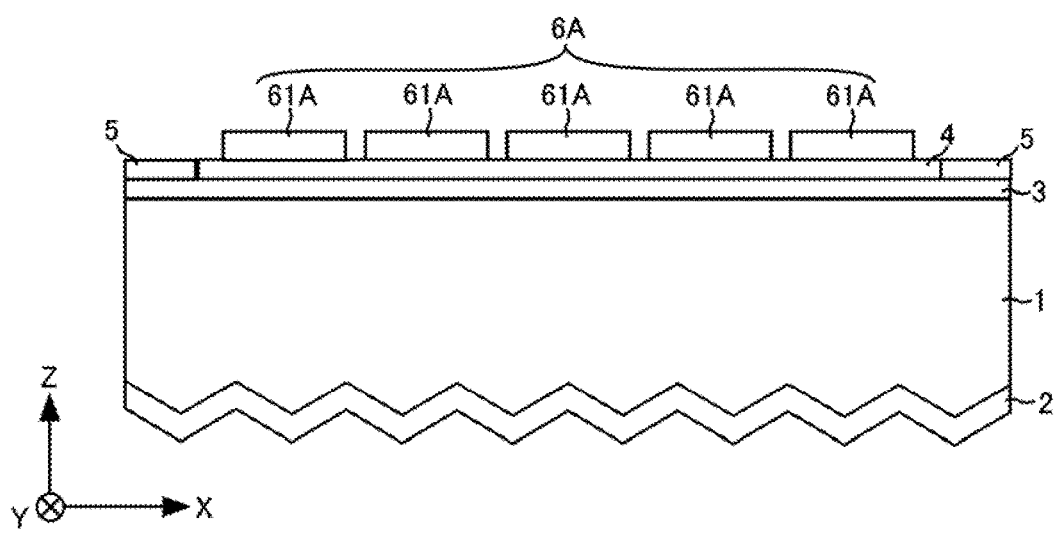
FIG. 12 is a cross-sectional view of the photovoltaic device shown in FIG. 11, taken along line XII-XII.

FIG. 11 is a plan view of a photovoltaic device in accordance with Embodiment 2. FIG. 12 is a cross-sectional view of the photovoltaic device shown in FIG. 11, taken along line XII-XII.

Referring to FIGS. 11 and 12, a photovoltaic device 10A in accordance with Embodiment 2 includes electrodes 6A in place of the electrodes 6 of the photovoltaic device 10 shown in FIGS. 1 to 3. The photovoltaic device 10A is otherwise the same as the photovoltaic device 10.

The electrodes 6A are disposed on the n-type amorphous semiconductor layer 4. The electrodes 6A are disposed in a plurality of electrode-provided regions 61A arranged at desired intervals along the x-axis direction. The electrode-provided regions 61A include electrode-provided regions 61a and 61b. The electrode-provided regions 61a are disposed closer to a y-axis end of the n-type amorphous semiconductor layer 4. The electrode-provided regions 61b are spaced apart from the electrode-provided regions 61a by a distance in the y-axis direction and disposed closer to the other y-axis end of the n-type amorphous semiconductor layer 4.

The electrodes 6A may be disposed in any of the electrode-provided regions 72 to 77 shown in FIG. 7. In such cases, the electrodes 6A may have the same shape in a plan view as the electrodes 7 or have a different shape in a plan view than the electrodes 7.

Since the electrodes 6A are disposed on the n-type amorphous semiconductor layer 4, the n-type amorphous semiconductor layer 4 includes, arranged along the y-axis direction: a plurality of electrode-provided regions where there are provided electrodes; and a plurality of no-electrode-provided regions, between the electrode-provided regions, where there are provided no electrodes.

The photovoltaic device 10A is manufactured by steps (a) to (k) shown in FIGS. 4 to 6, where in step (k), the electrodes 6A and 7 are formed on the n-type amorphous semiconductor layer 4 and the p-type amorphous semiconductor layer 5 respectively.

Both the n-type amorphous semiconductor layer 4 and the p-type amorphous semiconductor layer 5 in the photovoltaic device 10A include, arranged along the y-axis direction: a plurality of electrode-provided regions where there are provided electrodes; and a plurality of no-electrode-provided regions, between the electrode-provided regions, where there are provided no electrodes. Therefore, reflectance increases under long-wavelength light in the regions where the n-type amorphous semiconductor layer 4 is provided. This structure increases electric current generation under light over the photovoltaic device 10.

The n-type amorphous semiconductor layer 4 alone may include, arranged along the y-axis direction: a plurality of electrode-provided regions where there are provided electrodes; and a plurality of no-electrode-provided regions, between the electrode-provided regions, where there are provided no electrodes. Embodiment 2, by further decreasing electrode area ratio over this structure while maintaining low E-shade, further increases reflectance under long-wavelength light over the structure, which further increases electric current generation under light over the structure.

The description of Embodiment 1 applies to Embodiment 2 unless specifically mentioned.

Embodiment 3

Figure 13:
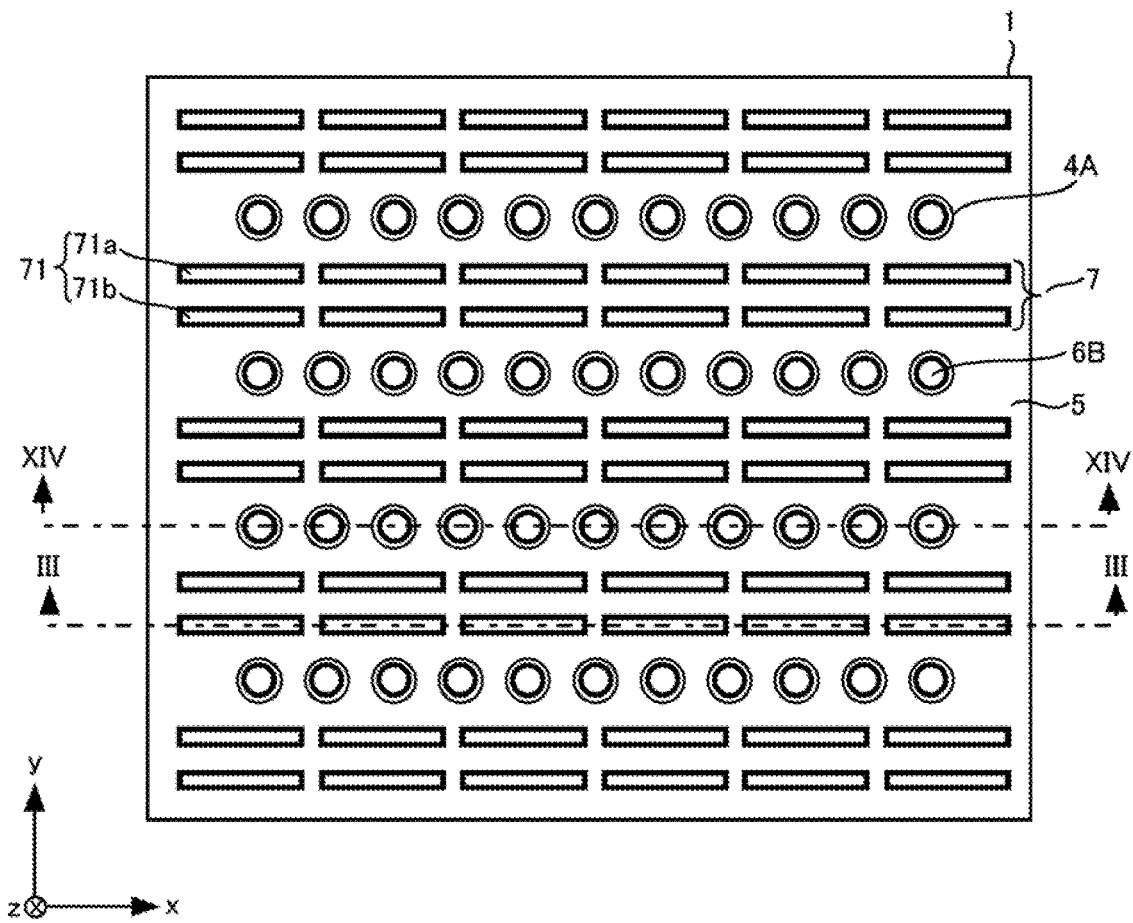
FIG. 13 is a plan view of a photovoltaic device in accordance with Embodiment 3.
Figure 14:
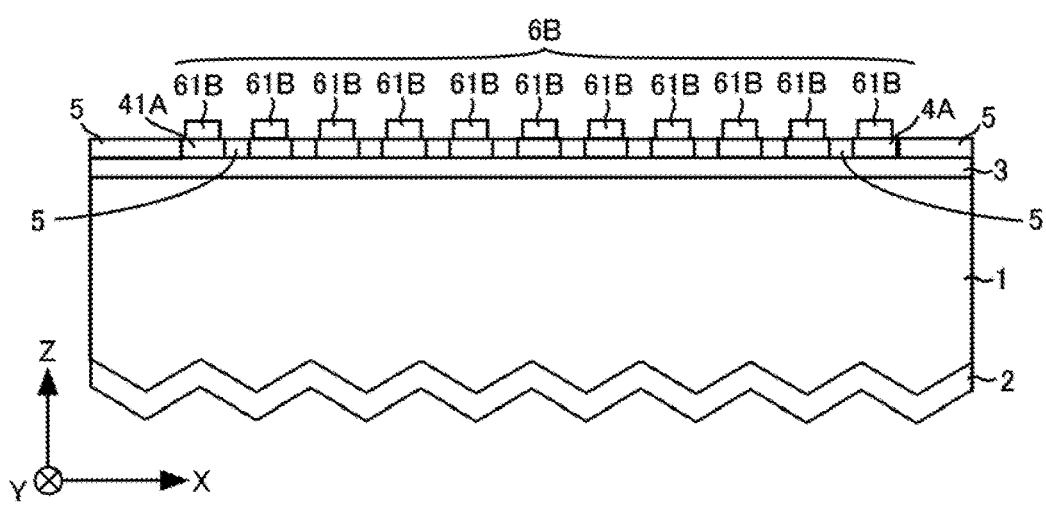
FIG. 14 is a cross-sectional view of the photovoltaic device shown in FIG. 13, taken along line XIV-XIV.

FIG. 13 is a plan view of a photovoltaic device in accordance with Embodiment 3. FIG. 14 is a cross-sectional view of the photovoltaic device shown in FIG. 13, taken along line XIV-XIV.

Referring to FIGS. 13 and 14, a photovoltaic device 10B in accordance with Embodiment 3 includes a n-type amorphous semiconductor layer 4A in place of the n-type amorphous semiconductor layer 4 of the photovoltaic device 10 shown in FIGS. 1 to 3 and electrodes 6B in place of the electrodes 6 of the photovoltaic device 10. The photovoltaic device 10B is otherwise the same as the photovoltaic device 10.

The n-type amorphous semiconductor layer 4A includes a plurality of n-type amorphous semiconductor layers 41A arranged on the i-type amorphous semiconductor layer 3 at desired intervals along the x-axis direction. The n-type amorphous semiconductor layers 41A have a dot-like shape in a plan view. The p-type amorphous semiconductor layer 5 is provided between those two n-type amorphous semiconductor layers 41A and 41A which are adjacent along the x-axis direction. The n-type amorphous semiconductor layers 41A are composed of the same material as the n-type amorphous semiconductor layer 4.

The n-type amorphous semiconductor layers 41A include a plurality of electrode-provided regions 61B where the electrodes 6B are provided. The electrode-provided regions 61B are disposed on the n-type amorphous semiconductor layers 41A and have a dot-like shape in a plan view. Hence, the electrode-provided regions 61B are arranged at desired intervals along the x-axis direction.

Since the n-type amorphous semiconductor layer 4A includes the dot-shaped n-type amorphous semiconductor layers 41A, the n-type amorphous semiconductor layers 41A are arranged along the x-axis direction, whereas the n-type amorphous semiconductor layer 4A and the p-type amorphous semiconductor layer 5 are arranged alternately along the y-axis direction. It is therefore possible to specify a direction from the n-type amorphous semiconductor layer 4A toward the p-type amorphous semiconductor layer 5 (or a direction from the p-type amorphous semiconductor layer 5 toward the n-type amorphous semiconductor layer 4A) in the photovoltaic device 10B.

Figure 15:
FIG. 15 is a first manufacturing step diagram representing steps of manufacturing the photovoltaic device shown in FIGS. 13 and 14.
Figure 15:
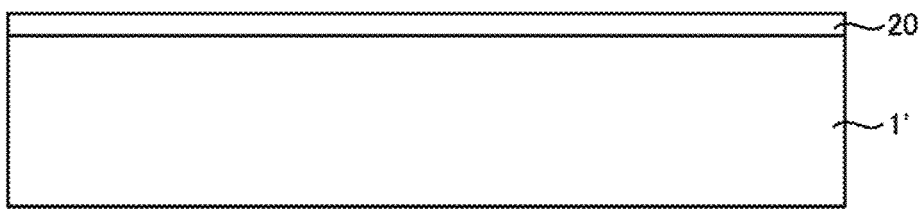
Figure 15:
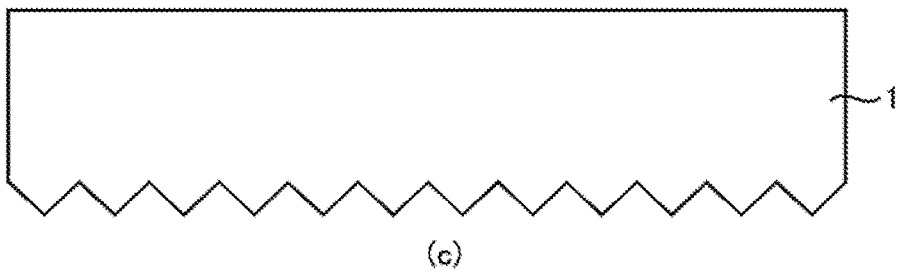
Figure 15:
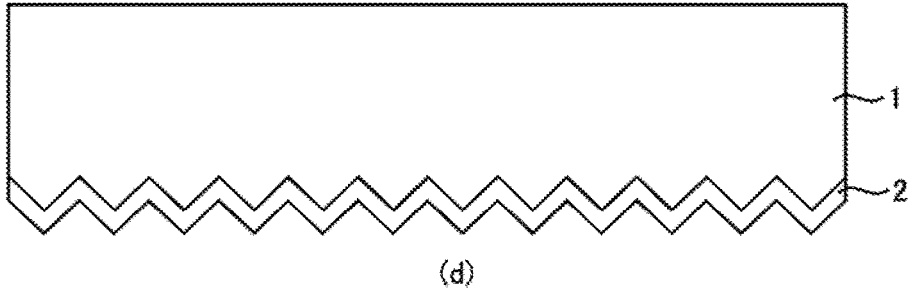
Figure 15:
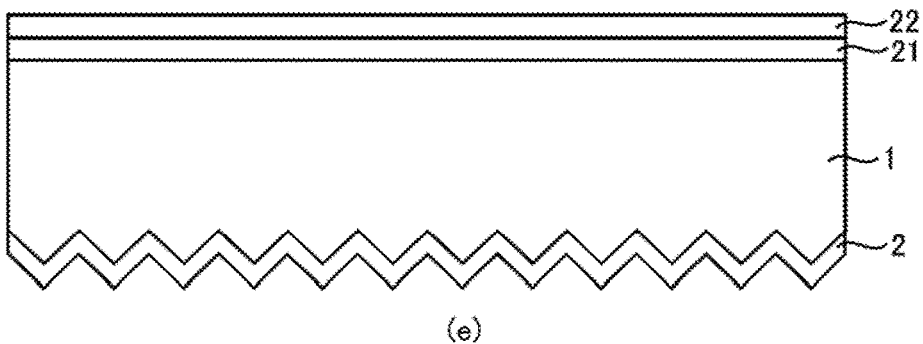
Figure 16:
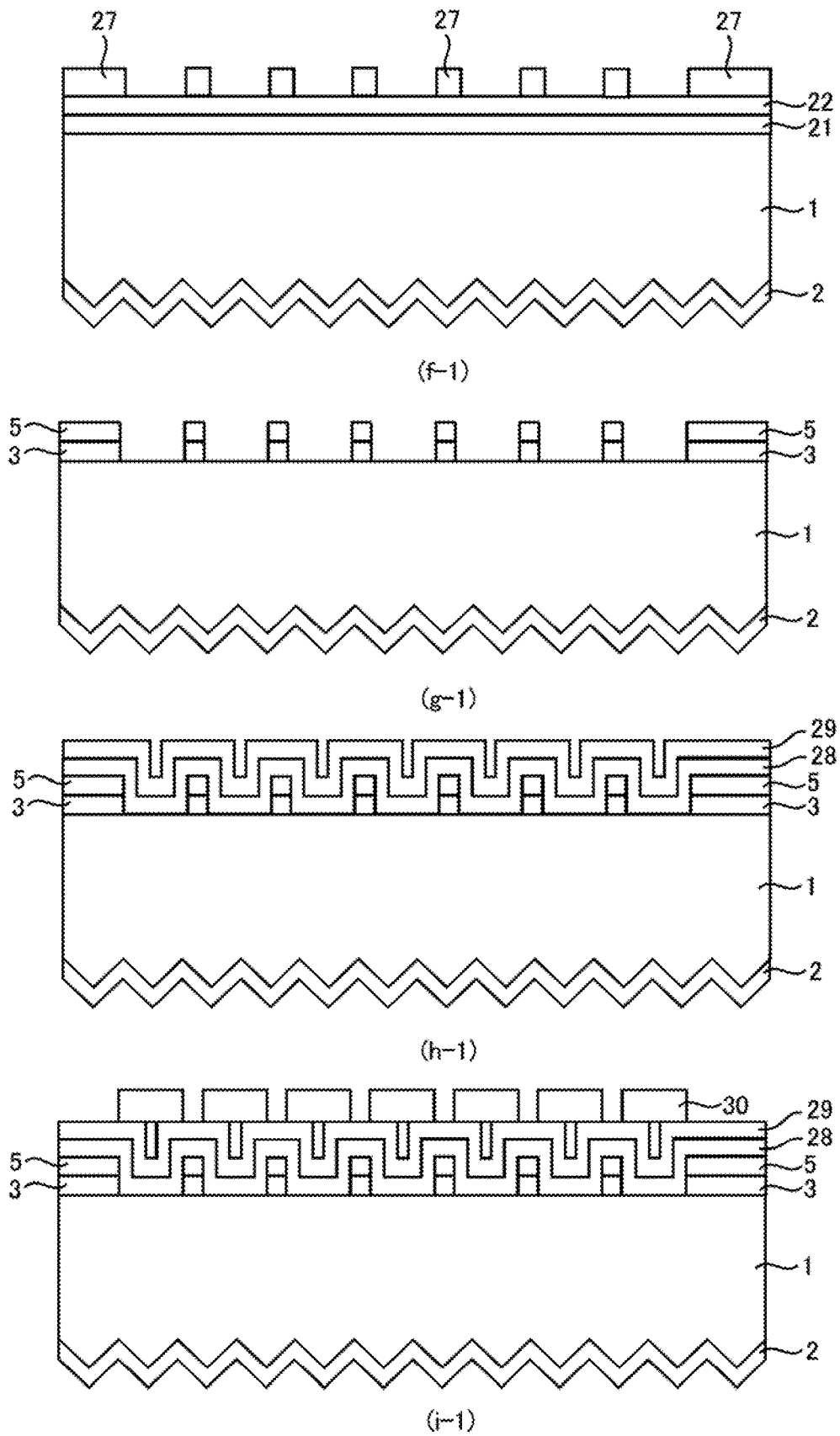
FIG. 16 is a second manufacturing step diagram representing steps of manufacturing the photovoltaic device shown in FIGS. 13 and 14.
Figure 17:
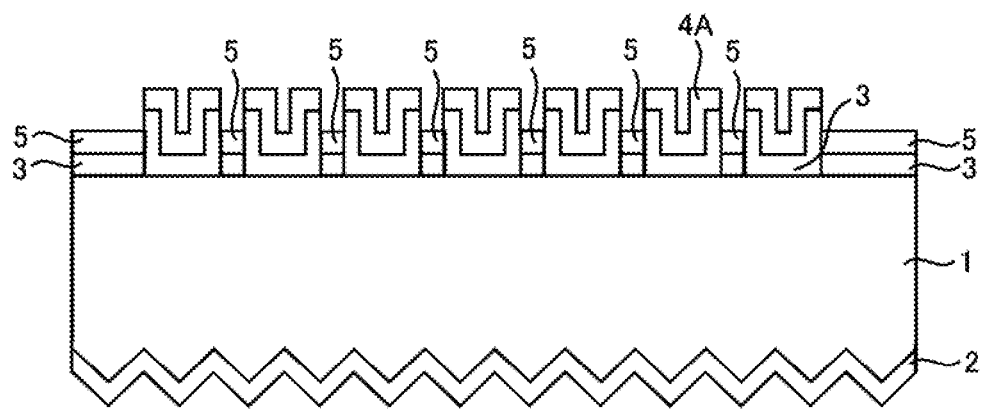
FIG. 17 is a third manufacturing step diagram representing steps of manufacturing the photovoltaic device shown in FIGS. 13 and 14.
Figure 17:
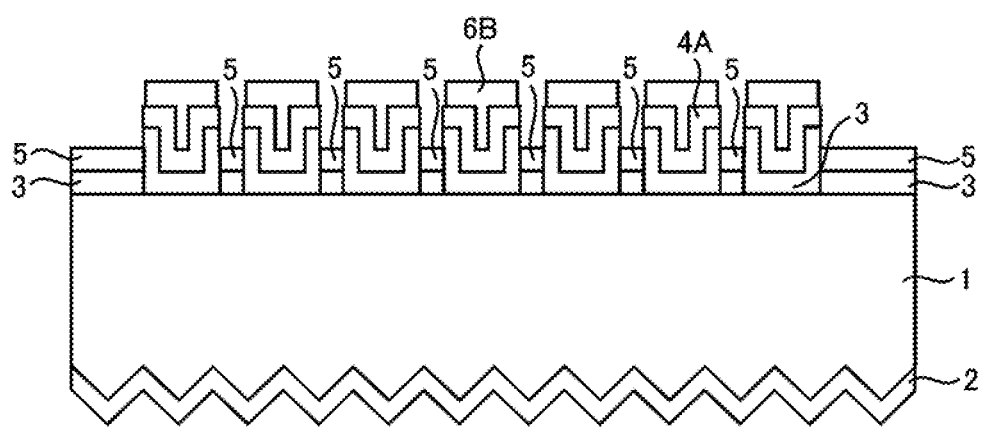

FIGS. 15 to 17 are, respectively, first to third manufacturing step diagrams representing steps of manufacturing the photovoltaic device 10B shown in FIGS. 13 and 14.

The manufacturing step diagrams shown in FIGS. 15 to 17 show steps (f-1) to (k-1) in place of steps (f) to (k) in the manufacturing step diagrams shown in FIGS. 4 to 6 and are otherwise the same as the manufacturing step diagrams shown in FIGS. 4 to 6.

Referring to FIG. 15, the same steps as steps (a) to (e) are sequentially carried out at the start of the manufacture of the photovoltaic device 10B (steps (a) to (e) in FIG. 15).

Following step (e), a photoresist is applied onto the p-type amorphous semiconductor layer 22 and patterned by photolithography to form a resist pattern 27 (step (f-1) in FIG. 16).

Next, a stack of the i-type amorphous semiconductor layer 21 and the p-type amorphous semiconductor layer 22 is partly etched out in the thickness direction using the resist pattern 27 as a mask (step (g-1) in FIG. 16). This step exposes dot-shaped parts of the backside of the semiconductor substrate 1 (surface of the semiconductor substrate 1 that is opposite the face thereof carrying the texture thereon). The step also forms the i-type amorphous semiconductor layer 3 and the p-type amorphous semiconductor layer 5.

An i-type amorphous semiconductor layer 28 is then formed in contact with the exposed parts of the backside of the semiconductor substrate 1 and also in contact with the p-type amorphous semiconductor layer 5. Thereafter, a n-type amorphous semiconductor layer 29 is formed in contact with the entire surface of the i-type amorphous semiconductor layer 28 (step (h-1) in FIG. 16). The i-type amorphous semiconductor layer 28 and the n-type amorphous semiconductor layer 29 may be formed by the same method as are the i-type amorphous semiconductor layer 24 and the n-type amorphous semiconductor layer 25.

Following step (h-1), a photoresist is applied onto the n-type amorphous semiconductor layer 29 and patterned by photolithography to form a resist pattern 30 (step (i-1) in FIG. 16).

Next, a stack of the i-type amorphous semiconductor layer 28 and the n-type amorphous semiconductor layer 29 is partly etched out in the thickness direction using the resist pattern 30 as a mask. The resist pattern 30 is then removed. This step exposes parts of the surface of the p-type amorphous semiconductor layer 5 (step (j-1) in FIG. 17). The step also forms the i-type amorphous semiconductor layer 3 and the n-type amorphous semiconductor layer 4A.

Then, the electrodes 6B are formed on the n-type amorphous semiconductor layer 4A (step (k-1) in FIG. 17). The electrodes 7 are also formed on the p-type amorphous semiconductor layer 5 (not shown in step (k-1)). The electrodes 6B and 7 may be formed by sputtering or vapor deposition using a metal or other mask. This step completes the manufacture of the photovoltaic device 10B.

The photovoltaic device 10B includes the n-type amorphous semiconductor layer 4A which in turn includes the n-type amorphous semiconductor layers 41A which have a dot-like shape in a plan view. The p-type amorphous semiconductor layer 5 includes, arranged along the y-axis direction: a plurality of electrode-provided regions where the electrodes 7 are disposed; and a plurality of no-electrode-provided regions, between the electrode-provided regions, where there are provided no electrodes 7.

Therefore, similarly to the photovoltaic device 10, this structure increases electric current generation of the photovoltaic device 10B under light.

Alternatively, the n-type amorphous semiconductor layer 4A in the photovoltaic device 10B may include, arranged along the y-axis direction: a plurality of electrode-provided regions where the electrodes 6B are disposed; and a plurality of no-electrode-provided regions, between the electrode-provided regions, where there are provided no electrodes 6B. This structure further increases electric current generation of the photovoltaic device 10B under light.

Figure 18:
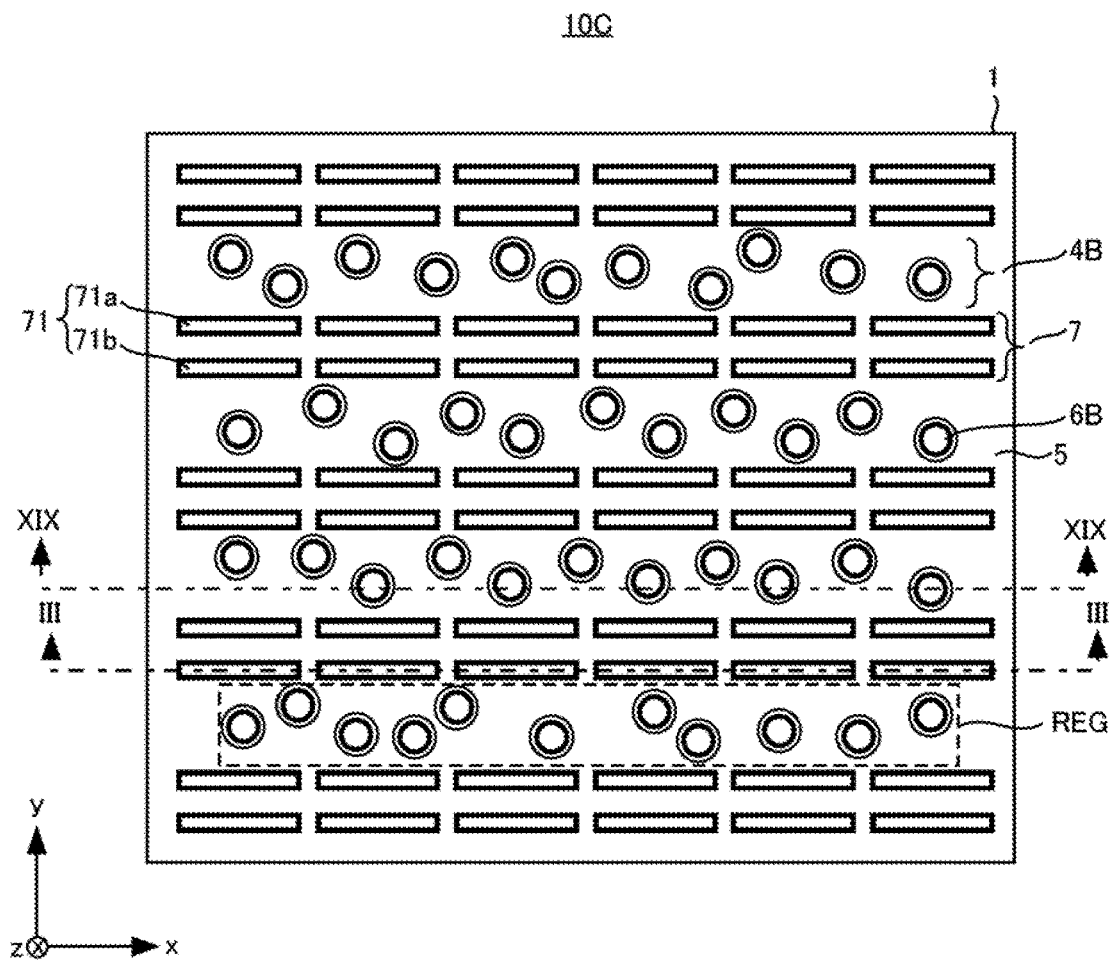
FIG. 18 a plan view of another photovoltaic device in accordance with Embodiment 3
Figure 19:
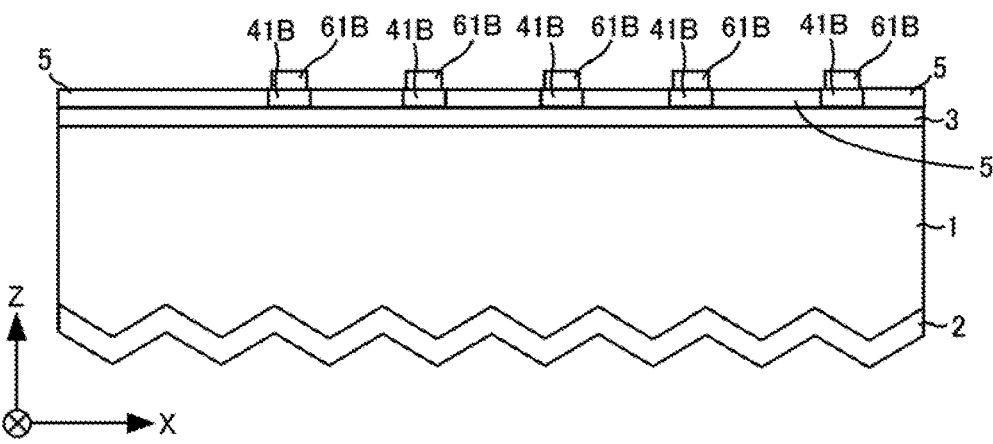
FIG. 19 is a cross-sectional view of the photovoltaic device shown in FIG. 18, taken along line XIX-XIX.

FIG. 18 is a plan view of another photovoltaic device in accordance with Embodiment 3. FIG. 19 is a cross-sectional view of the photovoltaic device shown in FIG. 18, taken along line XIX-XIX.

The photovoltaic device in accordance with Embodiment 3 may be a photovoltaic device 10C shown in FIGS. 18 and 19.

Referring to FIGS. 18 and 19, the photovoltaic device 10C includes a n-type amorphous semiconductor layer 4B in place of the n-type amorphous semiconductor layer 4A of the photovoltaic device 10B shown in FIGS. 13 and 14 and is otherwise the same as the photovoltaic device 10B.

The n-type amorphous semiconductor layer 4B includes a plurality of n-type amorphous semiconductor layers 41B arranged in a random manner between those two electrodes 7 and 7 which are adjacent along the y-axis direction. The n-type amorphous semiconductor layers 41B have a dot-like shape in a plan view. The n-type amorphous semiconductor layers 41B are composed of the same material as the n-type amorphous semiconductor layer 4.

Since the n-type amorphous semiconductor layer 4B includes the dot-shaped n-type amorphous semiconductor layers 41B, it is possible to specify regions REG where the n-type amorphous semiconductor layers 41B are disposed. The n-type amorphous semiconductor layer 4B and the p-type amorphous semiconductor layer 5 are therefore arranged alternately along the y-axis direction. It is therefore possible to specify a direction from the n-type amorphous semiconductor layer 4B toward the p-type amorphous semiconductor layer 5 (or a direction from the p-type amorphous semiconductor layer 5 toward the n-type amorphous semiconductor layer 4B) in the photovoltaic device 10C.

The n-type amorphous semiconductor layer 4B includes the electrode-provided regions 61B where the electrodes 6B are disposed. The electrode-provided regions 61B are arranged on the n-type amorphous semiconductor layers 41B at desired intervals along the x-axis direction.

Alternatively, the n-type amorphous semiconductor layers 41B in the photovoltaic device 10C may include, arranged along the y-axis direction: a plurality of electrode-provided regions where the electrodes 6B are disposed; and a plurality of no-electrode-provided regions, between the electrode-provided regions, where there are provided no electrodes 6B. This structure further increases electric current generation of the photovoltaic device 10C under light.

The description of Embodiments 1 and 2 applies to Embodiment 3 unless specifically mentioned.

The photovoltaic devices 10, 10A, 10B, and 10C have been described in Embodiments 1 to 3 as including the i-type amorphous semiconductor layer 3 on one of the faces of the semiconductor substrate 1 (the face opposite the light-incident face). Alternatively, in an embodiment of the present invention, the photovoltaic devices 10, 10A, 10B, and 10C may include an oxide semiconductor, in place of the i-type amorphous semiconductor layer 3, on one of the faces of the semiconductor substrate 1 (the face opposite the light-incident face). This oxide semiconductor has such a thickness that carriers (electrons and holes) can tunnel through the oxide semiconductor. Either the i-type amorphous semiconductor layer 3 or the oxide semiconductor forms a "passivation layer."

The semiconductor layer formed on one of the faces of the semiconductor substrate 1 (the face opposite the light-incident face) has been described as an amorphous semiconductor layer (the n-type amorphous semiconductor layers 4, 4A, and 4B and the p-type amorphous semiconductor layer 5). Alternatively, in an embodiment of the present invention, the semiconductor layer formed on one of the faces of the semiconductor substrate 1 (the face opposite the light-incident face) may be a polycrystalline semiconductor layer. The amorphous semiconductor layer and the polycrystalline semiconductor layer form a "non-monocrystalline semiconductor layer."

The present invention, in an embodiment thereof, is directed to a photovoltaic device including: a crystalline semiconductor substrate of a first conductivity type; first non-monocrystalline semiconductor layers of the first conductivity type on one of faces of the crystalline semiconductor substrate; second non-monocrystalline semiconductor layers of a second conductivity type that is opposite the first conductivity type at least on parts of that one of the faces of the crystalline semiconductor substrate, there being provided no first non-monocrystalline semiconductor layers in the parts; first electrodes on the first non-monocrystalline semiconductor layers; and second electrodes on the second non-monocrystalline semiconductor layers, wherein: the photovoltaic device has regions where the first non-monocrystalline semiconductor layers and the second non-monocrystalline semiconductor layers are arranged alternately along an in-plane direction of the crystalline semiconductor substrate; and the second non-monocrystalline semiconductor layers between those first non-monocrystalline semiconductor layers which are adjacent along an in-plane direction of the crystalline semiconductor substrate include, arranged along a first direction which is an in-plane direction of the crystalline semiconductor substrate pointing from the first non-monocrystalline semiconductor layers toward the adjacent first non-monocrystalline semiconductor layers: a first electrode-provided region where the second electrodes are disposed; a second electrode-provided region where the second electrodes are disposed; and a no-electrode-provided region, between the first electrode-provided region and the second electrode-provided region, where there are provided no second electrodes. In such cases, the first direction is the y-axis direction described above.

The embodiments and examples disclosed herein are for illustrative purposes only in every respect and provide no basis for restrictive interpretations. The scope of the present invention is defined only by the claims and never bound by the embodiments or examples. Those modifications and variations that may lead to equivalents of claimed elements are all included within the scope of the invention.

INDUSTRIAL APPLICABILITY

The present invention is applicable to photovoltaic devices.

REFERENCE SIGNS LIST

1 Semiconductor Substrate
2 Antireflective Film
3 I-type Amorphous Semiconductor Layer
4, 4A, 4B, 41A, 41B N-type Amorphous Semiconductor Layer
5 P-type Amorphous Semiconductor Layer
6 and 7 Electrode
6a, 6b, 61, 61A, 61B, 71, 71a, 71b, 72,72a, 72b, 72c, 72d, 73, 73a, 74, 74a, 74b, 74c, 75, 751 to 753, 751a, 751b, 751c, 76, 761 to 763, 77, 771 to 773, 771a, 771b, 771c Electrode-provided Region
72d, 73b, 74d, 75d, 761c, 771d No-electrode-provided Regions
10, 10A, 10B, 10C Photovoltaic Device
50 and 60 Wire
51 to 53 Conductive Adhesive

What is claimed is:

1. A photovoltaic device comprising:
a crystalline semiconductor substrate of a first conductivity type;
a first non-monocrystalline semiconductor layer of the first conductivity type on one of faces of the crystalline semiconductor substrate;
a second non-monocrystalline semiconductor layer of a second conductivity type that is opposite the first conductivity type at least on parts of that one of the faces of the crystalline semiconductor substrate, there being provided no first non-monocrystalline semiconductor layer in the parts;
a first electrode on the first non-monocrystalline semiconductor layer; and
a second electrode on the second non-monocrystalline semiconductor layer,
wherein:
the second non-monocrystalline semiconductor layer includes a first electrode-provided region, a first no-electrode-provided region and a second electrode-provided region in this order along a first direction from the first non-monocrystalline semiconductor layer toward the second non-monocrystalline semiconductor layer;

each of the first electrode-provided region and the second electrode-provided region is a region where the second electrode is disposed, and the first no-electrode-provided region is a region where the second electrode is not disposed; and the first electrode-provided region, the first no-electrode-provided region, and the second electrode-provided region are consecutively arranged in this order in the first direction.

2. The photovoltaic device according to claim 1, wherein the first non-monocrystalline semiconductor layer includes a third electrode-provided region, a second no-electrode-provided region, and a fourth electrode-provided region in this order along the first direction;

each of the third electrode-provided region and the fourth electrode-provided region is a region where the first electrode is disposed, and the second no-electrode-provided region is a region where the first electrode is not disposed; and the third electrode-provided region, the second no-electrode-provided region, and the fourth electrode-provided region are consecutively arranged in this order in the first direction.

3. The photovoltaic device according to claim 1, wherein the first electrode-provided region is located one end side of the second non-monocrystalline semiconductor layer in the first direction; and the second electrode-provided region is located an other end side of the second non-monocrystalline semiconductor layer and at a distance from the first electrode-provided region in the first direction.

4. The photovoltaic device according to claim 3, wherein the second non-monocrystalline semiconductor layer further includes a fifth electrode-provided region where the second electrode is disposed; and the fifth electrode-provided region connects the first electrode-provided region and the second electrode-provided region.

5. The photovoltaic device according to claim 4, further comprising:

a first wire connected to the first electrode via a conductive adhesive; and a second wire connected to the second electrode via a conductive adhesive;

wherein the second wire is connected to the second electrodes via a conductive adhesive at least in the fifth electrode-provided region.

6. The photovoltaic device according to claim 1, further comprising:

a first wire connected to the first electrode via a conductive adhesive; and a second wire connected to the second electrode via a conductive adhesive.

* * * * *